US012712465B2

(12) United States Patent
Fukase et al.

(10) Patent No.: US 12,712,465 B2
(45) Date of Patent: Aug. 18, 2026

(54) POWER CONVERSION DEVICE

(71) Applicant: Mitsubishi Electric Corporation, Tokyo (JP)

(72) Inventors: Tatsuya Fukase, Tokyo (JP); Shinichiro Yotsumoto, Tokyo (JP); Kakeru Iwashita, Tokyo (JP); Masaki Horii, Tokyo (JP); Yasuhiko Kitamura, Tokyo (JP); Takuya Tamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 169 days.

(21) Appl. No.: 18/846,069

(22) PCT Filed: Oct. 31, 2022

(86) PCT No.: PCT/JP2022/040681
§ 371 (c)(1),
(2) Date: Sep. 11, 2024

(87) PCT Pub. No.: WO2023/188502
PCT Pub. Date: Oct. 5, 2023

(65) Prior Publication Data

US 2025/0183816 A1 Jun. 5, 2025

(30) Foreign Application Priority Data

Mar. 29, 2022 (JP) ................................ 2022-052694

(51) Int. Cl.
*H02M 7/00* (2006.01)
*H02M 1/32* (2007.01)
(Continued)

(52) U.S. Cl.
CPC ........... *H02M 7/003* (2013.01); *H02M 1/327* (2021.05); *H02M 7/53873* (2013.01);
(Continued)

(58) Field of Classification Search
CPC .. H02M 1/327; H02M 7/003; H02M 7/53873; H10W 72/884; H10W 90/00; H10W 90/756; H10W 90/736
See application file for complete search history.

(56) References Cited

U.S. PATENT DOCUMENTS

2003/0072117 A1* 4/2003 Maekawa .............. H02M 1/32
361/86
2013/0322487 A1* 12/2013 Watanabe ............. G01K 1/026
374/4

(Continued)

FOREIGN PATENT DOCUMENTS

JP 6522232 B2 5/2019
JP 2020-58192 A 4/2020

OTHER PUBLICATIONS

International Search Report for PCT/JP2022/040681, dated Jan. 17, 2023.

*Primary Examiner* — Jue Zhang
(74) *Attorney, Agent, or Firm* — Sughrue Mion, PLLC

(57) ABSTRACT

A power conversion device includes a power conversion unit and a control unit. The power conversion unit includes a first semiconductor module. The first semiconductor module includes a plurality of power semiconductor elements. Some of the plurality of power semiconductor elements are detection target elements. The power conversion unit further includes a temperature sensor and a voltage sensor. The temperature sensor detects a surface temperature of the detection target element as a sensor position temperature. The voltage sensor detects an inter-terminal voltage of the detection target element. The control unit calculates a loss in the detection target element based on the sensor position temperature and the inter-terminal voltage, and estimates a maximum temperature based on the calculated loss.

12 Claims, 13 Drawing Sheets

(51) Int. Cl.
*H02M 7/5387* (2007.01)
*H10W 72/00* (2026.01)
*H10W 90/00* (2026.01)

(52) U.S. Cl.
CPC .......... *H10W 72/884* (2026.01); *H10W 90/00* (2026.01); *H10W 90/736* (2026.01); *H10W 90/756* (2026.01)

(56) References Cited

U.S. PATENT DOCUMENTS

2014/0035658 A1* 2/2014 Usui .......................... G05F 1/10 327/512
2019/0051640 A1* 2/2019 Yano ..................... H02M 7/003
2020/0112245 A1* 4/2020 Mitsui ..................... H02M 1/32
2023/0327541 A1* 10/2023 Inoue .................. H02M 1/0009 363/56.02

* cited by examiner 10
20
POWER CONVERSION UNIT
CONTROL UNIT 21
22
23
21U
21L
22U
22L
23U
23L
21a
21b
21c
21d
22a
22b
22c
22d
23a
23b
23c
23d
211
212
213
214
221
222
223
224
231
232
233
234
30
31
32
33
40
50
60
61
62
63

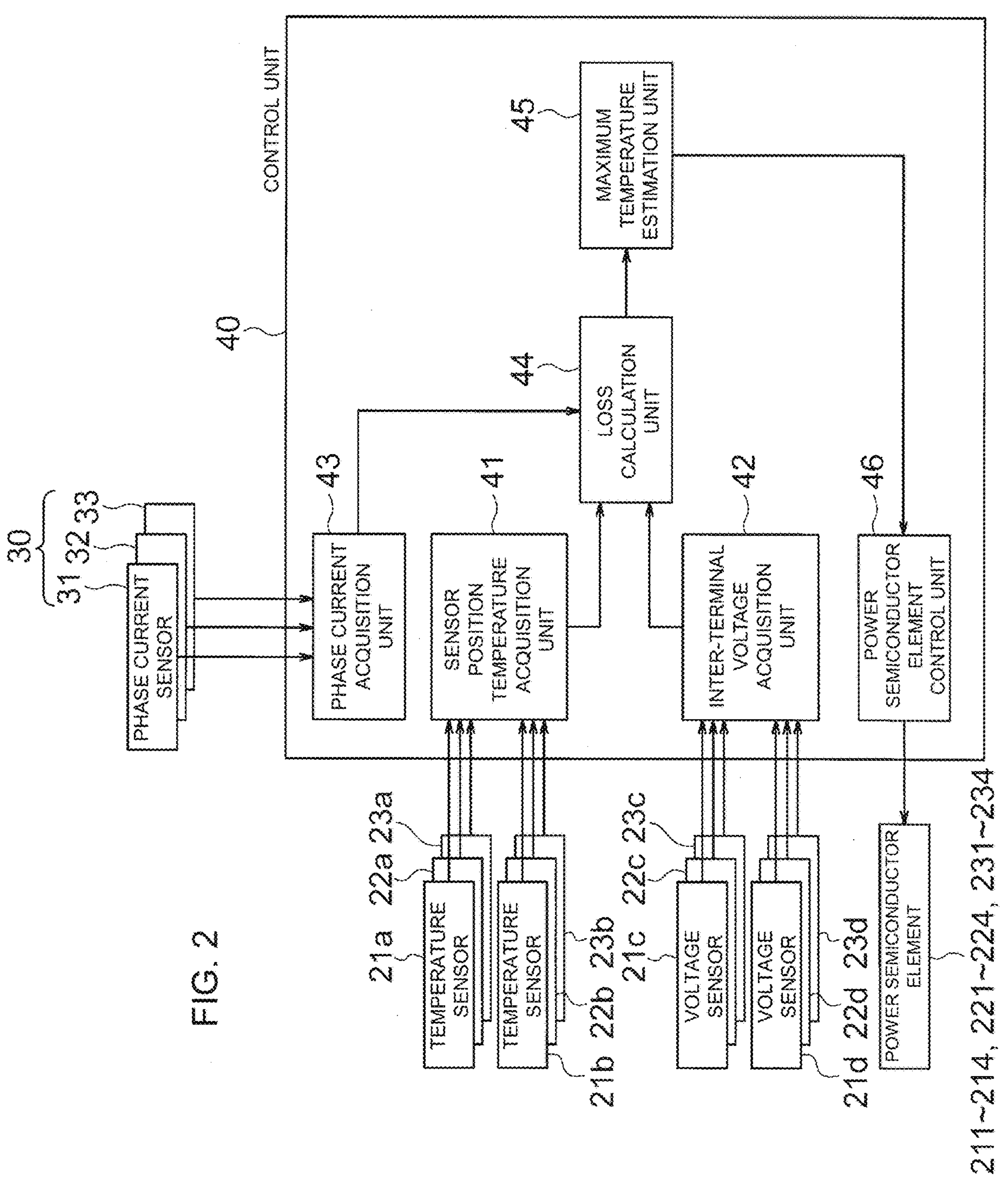

FIG. 2
30
31
32
33
PHASE CURRENT SENSOR
40
CONTROL UNIT
43
PHASE CURRENT ACQUISITION UNIT
41
SENSOR POSITION TEMPERATURE ACQUISITION UNIT
42
INTER-TERMINAL VOLTAGE ACQUISITION UNIT
44
LOSS CALCULATION UNIT
45
MAXIMUM TEMPERATURE ESTIMATION UNIT
46
POWER SEMICONDUCTOR ELEMENT CONTROL UNIT
21a 22a 23a
TEMPERATURE SENSOR
21b 22b 23b
TEMPERATURE SENSOR
21c 22c 23c
VOLTAGE SENSOR
21d 22d 23d
VOLTAGE SENSOR
POWER SEMICONDUCTOR ELEMENT
211~214, 221~224, 231~234

POWER CONVERSION DEVICE

CROSS REFERENCE TO RELATED APPLICATIONS

This application is a National Stage of International Application No. PCT/JP2022/040681 filed Oct. 31, 2022, claiming priority based on Japanese Patent Application No. 2022-052694 filed Mar. 29, 2022.

TECHNICAL FIELD

The present disclosure relates to a power conversion device.

BACKGROUND ART

In a voltage conversion device of the related art, a temperature and an inter-terminal voltage of a switching element are detected in order to detect an overcurrent state of the switching element. A temperature sensor for detecting the temperature of the switching element is arranged on a chip of the switching element (see, for example, Patent Literature 1).

CITATION LIST

Patent Literature

[PTL 1] JP 2020-58192 A

SUMMARY OF INVENTION

Technical Problem

A surface temperature of the switching element is usually not uniform, and hence there is a difference between a temperature detected by the temperature sensor and a temperature at a maximum temperature point on the surface of the switching element. Further, a surface temperature distribution changes depending on the amount of heat generated by the switching element. In a related-art power conversion devices such as the above-mentioned device, in order to protect the switching element from overheating, a maximum value of the difference between the temperature detected by the temperature sensor and the temperature at the maximum temperature point on the surface of the switching element is required to be set as a temperature margin. Therefore, there is a problem in that, depending on a heat generation state of the switching element, the output of the switching element may be limited even though it is not required to limit the output.

The present disclosure has been made to solve the problem described above, and an object of the present disclosure is to provide a power conversion device capable of protecting a power semiconductor element from overheating more appropriately.

Solution to Problem

According to one embodiment of the present disclosure, there is provided a power conversion device including: a power conversion unit including a power semiconductor module including a plurality of power semiconductor elements, the power conversion unit being configured to convert direct current power from an external power source into alternating current power to supply the alternating current power to a driving device; and a control unit configured to control operation of the plurality of power semiconductor elements, at least one of the plurality of power semiconductor elements being a detection target element for which a temperature is to be detected, the power conversion unit further including: a temperature sensor configured to detect a surface temperature of the detection target element as a sensor position temperature; and a voltage sensor configured to detect an inter-terminal voltage of the detection target element, the control unit being configured to calculate, when a position at which the temperature is highest on a surface of the detection target element is defined as a maximum temperature position, a loss in the detection target element based on the sensor position temperature and the inter-terminal voltage, and to estimate a maximum temperature which is the temperature at the maximum temperature position based on the calculated loss.

Advantageous Effects of Invention

According to the power conversion device of the present disclosure, it is possible to protect the power semiconductor element from overheating more appropriately.

BRIEF DESCRIPTION OF DRAWINGS

FIG. 2 is a block diagram for illustrating a configuration of a control unit of FIG. 1.

DESCRIPTION OF EMBODIMENTS

Now, embodiments of the present disclosure are described with reference to the drawings.

First Embodiment

Figure 1:
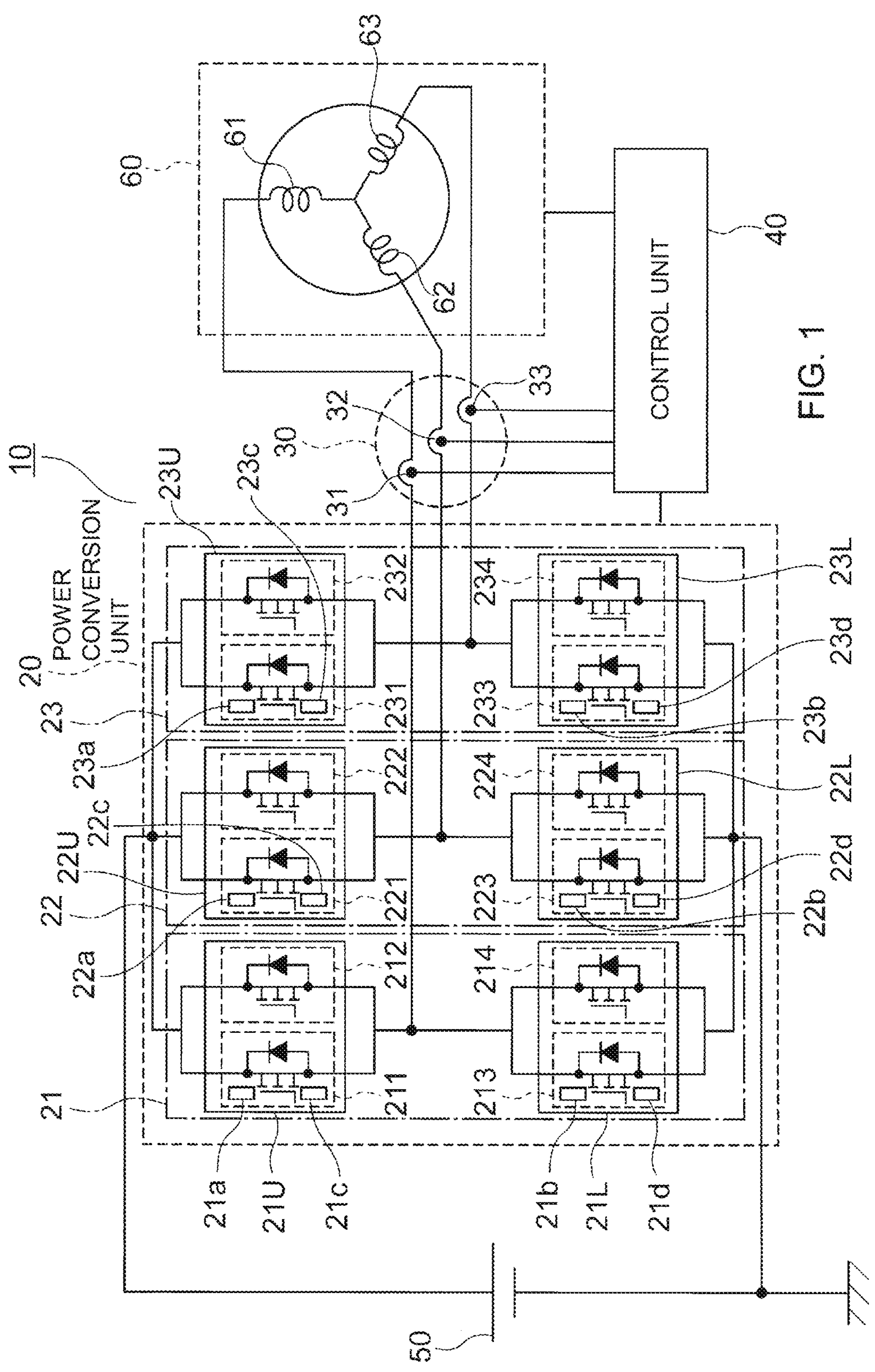
FIG. 1 is a configuration diagram for illustrating a power conversion device according to a first embodiment of the present disclosure, with a part of the power conversion device illustrated in the form of a block diagram.

FIG. 1 is a configuration diagram for illustrating a power conversion device according to a first embodiment of the present disclosure, with a part of the power conversion device illustrated in the form of a block diagram. A power conversion device 10 includes a power conversion unit 20, a phase current sensor 30, and a control unit 40.

The power conversion unit 20 is connected to a direct current power source 50 serving as an external power source. The power conversion unit 20 is also connected to a motor 60 serving as a driving device. The power conversion unit 20 converts direct current power from the direct current power source 50 into three-phase alternating current power, and supplies the converted three-phase alternating current power to the motor 60.

The power conversion unit 20 includes a first semiconductor module 21, a second semiconductor module 22, and a third semiconductor module 23.

The first semiconductor module 21 includes an upper arm 21U and a lower arm 21L. The first semiconductor module 21 includes a plurality of power semiconductor elements 211, 212, 213, and 214. The plurality of power semiconductor elements 211, 212, 213, and 214 include a plurality of upper arm elements and a plurality of lower arm elements. The plurality of upper arm elements are the power semiconductor elements 211 and 212, and the plurality of lower arm elements are the power semiconductor elements 213 and 214. The plurality of upper arm elements are included in the upper arm 21U, and are connected to each other in parallel. The plurality of lower arm elements are included in the lower arm 21L, and are connected to each other in parallel.

Among the plurality of power semiconductor elements 211, 212, 213, and 214, the power semiconductor elements 211 and 213 are detection target elements. The detection target element is a power semiconductor element for which a temperature is to be detected. Specifically, only one of the plurality of upper arm elements and only one of the plurality of lower arm elements are each the detection target element.

The second semiconductor module 22 includes an upper arm 22U and a lower arm 22L. The second semiconductor module 22 includes a plurality of power semiconductor elements 221, 222, 223, and 224. The plurality of power semiconductor elements 221, 222, 223, and 224 include a plurality of upper arm elements and a plurality of lower arm elements. The plurality of upper arm elements are the power semiconductor elements 221 and 222, and the plurality of lower arm elements are the power semiconductor elements 223 and 224. The plurality of upper arm elements are included in the upper arm 22U, and are connected to each other in parallel. The plurality of lower arm elements are included in the lower arm 22L, and are connected to each other in parallel.

Among the plurality of power semiconductor elements 221, 222, 223, and 224, the power semiconductor elements 221 and 223 are detection target elements. Specifically, only one of the plurality of upper arm elements and only one of the plurality of lower arm elements are each the detection target element.

The third semiconductor module 23 includes an upper arm 23U and a lower arm 23L. The third semiconductor module 23 includes a plurality of power semiconductor elements 231, 232, 233, and 234. The plurality of power semiconductor elements 231, 232, 233, and 234 include a plurality of upper arm elements and a plurality of lower arm elements. The plurality of upper arm elements are the power semiconductor elements 231 and 232, and the plurality of lower arm elements are the power semiconductor elements 233 and 234. The plurality of upper arm elements are included in the upper arm 23U, and are connected to each other in parallel. The plurality of lower arm elements are included in the lower arm 23L, and are connected to each other in parallel.

Among the plurality of power semiconductor elements 231, 232, 233, and 234, the power semiconductor elements 231 and 233 are detection target elements. Specifically, only one of the plurality of upper arm elements and only one of the plurality of lower arm elements are each the detection target element.

Each power semiconductor element is built from an insulated gate bipolar transistor (IGBT) and a freewheeling diode. The freewheeling diode is connected in antiparallel between a collector and an emitter of the IGBT.

In addition, the power conversion unit 20 includes temperature sensors 21*a*, 21*b*, 22*a*, 22*b*, 23*a*, and 23*b*, and voltage sensors 21*c*, 21*d*, 22*c*, 22*d*, 23*c*, and 23*d*. Each temperature sensor detects the surface temperature of the detection target element as a sensor position temperature Ts.

The temperature sensor 21*a* detects the surface temperature of the power semiconductor element 211, and the temperature sensor 21*b* detects the surface temperature of the power semiconductor element 213. The temperature sensor 22*a* detects the surface temperature of the power semiconductor element 221, and the temperature sensor 22*b* detects the surface temperature of the power semiconductor element 223. The temperature sensor 23*a* detects the surface temperature of the power semiconductor element 231, and the temperature sensor 23*b* detects the surface temperature of the power semiconductor element 233. A thermistor is used for each temperature sensor.

Each voltage sensor detects an inter-terminal voltage Vce of the detection target element. The inter-terminal voltage Vce is a collector-emitter voltage of the power semiconductor element. The voltage sensor 21*c* detects the inter-terminal voltage Vce of the power semiconductor element 211, and the voltage sensor 21*d* detects the inter-terminal voltage Vce of the power semiconductor element 213. The voltage sensor 22*c* detects the inter-terminal voltage Vce of the power semiconductor element 221, and the voltage sensor 22*d* detects the inter-terminal voltage Vce of the power semiconductor element 223. The voltage sensor 23*c* detects the inter-terminal voltage Vce of the power semiconductor element 231, and the voltage sensor 23*d* detects inter-terminal voltage Vce of the power semiconductor element 233. Each voltage sensor is connected to electrodes arranged at the collector and the emitter, respectively, of each power semiconductor element.

The control unit 40 controls operation of the plurality of power semiconductor elements. When a position at which the temperature is highest on the surface of the detection target element is defined as a maximum temperature position, the control unit 40 calculates a loss in the detection target element based on the sensor position temperature Ts and the inter-terminal voltage Vce.

Further, the control unit 40 estimates a maximum temperature Tj max based on the calculated loss. The maximum temperature Tj max is the temperature at the maximum temperature position.

The first semiconductor module 21, the second semiconductor module 22, and the third semiconductor module 23 correspond to a U-phase, a V-phase, and a W-phase of the motor 60, respectively. The motor 60 includes a U-phase winding 61, a V-phase winding 62, and a W-phase winding 63.

The phase current sensor 30 includes a U-phase phase current sensor 31, a V-phase phase current sensor 32, and a W-phase phase current sensor 33. The U-phase phase current sensor 31 detects the electric current flowing through the U-phase winding 61. The V-phase phase current sensor 32 detects the electric current flowing through the V-phase winding 62. The W-phase phase current sensor 33 detects the electric current flowing through the W-phase winding 63.

One of wiring for U-phase power supply is connected to between the upper arm 21U and the lower arm 21L, and the other of the wiring for U-phase power supply is connected to the U-phase winding 61. The U-phase phase current sensor 31 is arranged on the U-phase power supply wiring.

One of wiring for V-phase power supply is connected to between the upper arm 22U and the lower arm 22L, and the other of the wiring for V-phase power supply is connected to the V-phase winding 62. The V-phase phase current sensor 32 is arranged on the V-phase power supply wiring.

One of wiring for W-phase power supply is connected to between the upper arm 23U and the lower arm 23L, and the other of the wiring for W-phase power supply is connected to the W-phase winding 63. The W-phase phase current sensor 33 is arranged on the W-phase power supply wiring.

The control unit 40 controls the operation of each of the power semiconductor elements 211 to 214, 221 to 224, and 231 to 234. The control unit 40 acquires the sensor position temperature Ts of the corresponding detection target element from each temperature sensor, and acquires the inter-terminal voltage Vce of the corresponding detection target element from each voltage sensor.

The control unit 40 calculates the loss in each detection target element based on the sensor position temperature Ts of the detection target element detected by each temperature sensor and the inter-terminal voltage Vce of the detection target element detected by each voltage sensor.

The control unit 40 estimates the temperature at the maximum temperature position of each detection target element based on the calculated loss in each detection target element. The maximum temperature position is the position having the highest temperature on the surface of each detection target element.

The control unit 40 acquires the electric current flowing through the U-phase winding 61 from the U-phase phase current sensor 31, the electric current flowing through the V-phase winding 62 from the V-phase phase current sensor 32, and the electric current flowing through the W-phase winding 63 from, the W-phase phase current sensor 33.

FIG. 2 is a block diagram for illustrating a configuration of the control unit 40 of FIG. 1. The control unit 40 includes, as functional blocks, a sensor position temperature acquisition unit 41, an inter-terminal voltage acquisition unit 42, a phase current acquisition unit 43, a loss calculation unit 44, a maximum temperature estimation unit 45, and a power semiconductor element control unit 46.

The sensor position temperature acquisition unit 41 acquires the sensor position temperature Ts of each detection target element from the temperature sensors 21*a*, 21*b*, 22*a*, 22*b*, 23*a*, and 23*b*.

The inter-terminal voltage acquisition unit 42 acquires the inter-terminal voltage Vce of each detection target element from the voltage sensors 21*c*, 21*d*, 22*c*, 22*d*, 23*c*, and 23*d*.

The phase current acquisition unit 43 acquires the phase current of the U-phase, the phase current of the V-phase, and the phase current of the W-phase from the U-phase phase current sensor 31, the V-phase phase current sensor 32, and the W-phase phase current sensor 33, respectively.

The sensor position temperature Ts of each detection target element acquired by the sensor position temperature acquisition unit 41 and the inter-terminal voltage Vce of each detection target element acquired by the inter-terminal voltage acquisition unit 42 are input to the loss calculation unit 44. The loss calculation unit 44 calculates the loss in each detection target element based on the sensor position temperature Ts of each detection target element and the inter-terminal voltage Vce of each detection target element.

A specific description is now given of the detection target elements taking the power semiconductor element 211 as an example. The loss calculation unit 44 stores in advance a first map which is a map that defines a relationship between the sensor position temperature Ts of the power semiconductor element 211 and an on-resistance Ron of the power semiconductor element 211. The loss calculation unit 44 calculates the on-resistance Ron of the power semiconductor element 211 by applying the sensor position temperature Ts acquired from the temperature sensor 21*a* to the first map.

The loss calculation unit 44 calculates an on-current Ion of the power semiconductor element 211 as a first current value by dividing the inter-terminal voltage Vce acquired from the voltage sensor 21*c* by the calculated on-resistance Ron.

Further, the loss calculation unit 44 stores in advance a second map which is a map that defines a relationship of the on-current Ion of the power semiconductor element 211, a power factor of the power semiconductor element 211, and a modulation factor of the power semiconductor element 211 with respect to the loss of the power semiconductor element 211. The loss of the power semiconductor element 211 includes a conduction loss of the power semiconductor element 211 and a switching loss of the power semiconductor element 211. The loss calculation unit 44 calculates the loss of the power semiconductor element 211 by applying the calculated on-current Ion of the power semiconductor element 211, the power factor of the power semiconductor element 211, and the modulation factor of the power semiconductor element 211 to the second map.

The maximum temperature estimation unit 45 estimates the maximum temperature Tj max of the power semiconductor element 211 based on the loss of the power semiconductor element 211 calculated by the loss calculation unit 44.

The method of estimating the maximum temperature Tj max is now specifically described. The maximum temperature estimation unit 45 stores in advance a third map which is a map that defines a relationship between a thermal resistance difference function ΔZth(t) and a temperature increase value ΔT of the power semiconductor element 211. The thermal resistance difference function ΔZth(t) is a function of the difference between a first thermal resistance Zth(t)j-ref and a second thermal resistance Zth(t)s-ref.

The first thermal resistance Zth(t)j-ref is the thermal resistance between a maximum temperature position P1 and a reference position Pref in a heat dissipation path of the first semiconductor module 21. The maximum temperature position P1 is the position exhibiting the maximum temperature Tj max on the surface of the power semiconductor element 211 when electric power is supplied to the power semiconductor element 211. The reference position Pref may be any position set in the heat dissipation path of the first semiconductor module 21.

Further, the second thermal resistance Zth(t)s-ref is the thermal resistance between a sensor temperature position P2 and the reference position Pref. The sensor temperature position P2 is the position at which the surface temperature of the power semiconductor element 211 is detected by the temperature sensor 21*a* when electric power is supplied to the power semiconductor element 211. The first thermal resistance Zth(t)j-ref and the second thermal resistance Zth(t)s-ref are functions with respect to a power supply time "t".

The maximum temperature Tj max estimated by the maximum temperature estimation unit 45 is input to the power semiconductor element control unit 46. The power semiconductor element control unit 46 determines whether or not the estimated maximum temperature Tj max exceeds a specified temperature. The power semiconductor element control unit 46 causes the power conversion unit 20 to limit the alternating current power supplied to the motor 60 when the maximum temperature Tj max exceeds the specified temperature. Meanwhile, when the maximum temperature Tj max does not exceed the specified temperature, the power semiconductor element control unit 46 causes the power conversion unit 20 to maintain the alternating current power supplied to the motor 60.

Figure 3:
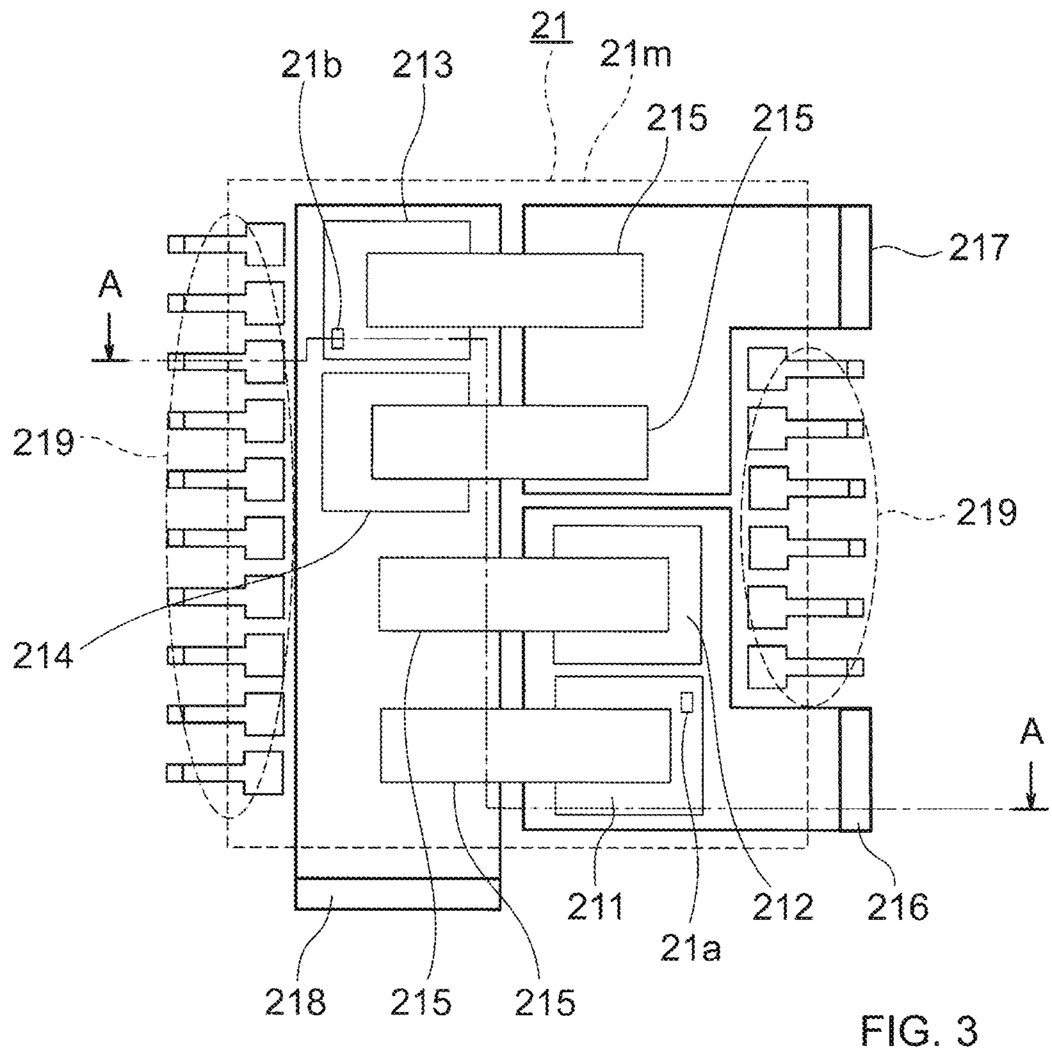
FIG. 3 is a top view for illustrating the structure of a first semiconductor module of FIG. 1.

FIG. 3 is a top view for illustrating the structure of the first semiconductor module 21 of FIG. 1. The first semiconductor module 21 includes a plurality of inner leads 215, a P lead 216, an N lead 217, and an AC lead 218 serving as a plurality of power leads, and a plurality of signal leads 219.

The plurality of inner leads 215 are each formed of a conductive metal member. The P lead 216, the N lead 217, the AC lead 218, and the plurality of signal leads 219 are each formed of a conductive metal member. The P lead 216, the N lead 217, the AC lead 218, and the plurality of signal leads 219 are obtained by cutting from an integrally molded lead frame.

The P lead 216, the N lead 217, and the AC lead 218 each have a mounting surface. The mounting surface is a surface for mounting at least one of the plurality of power semiconductor elements and the plurality of inner leads 215, and is the upper surface of the P lead 216, the N lead 217, and the AC lead 218 in FIG. 3.

The lower surface of the power semiconductor element 211 and the lower surface of the power semiconductor element 212 are connected to the P lead 216 on the mounting surface of the P lead 216. The lower surfaces of two inner leads 215 are connected to the N lead 217 on the mounting surface of the N lead 217. The lower surface of the power semiconductor element 213, the lower surface of the power semiconductor element 214, and the lower surfaces of the two inner leads 215 are connected to the AC lead 218 on the mounting surface of the AC lead 218.

The P lead 216 is connected to a positive terminal of the direct current power source 50 via a wiring member external to the first semiconductor module 21. The N lead 217 is connected to a negative terminal of the direct current power source 50 via a wiring member external to the first semiconductor module 21. The AC lead 218 is connected to the U-phase winding 61 via a wiring member external to the first semiconductor module 21.

The plurality of signal leads 219 include a lead into which a gate signal, which is a signal for controlling the operation of each power semiconductor element, is input. Further, the plurality of signal leads 219 include a pair of leads for the temperature sensor 21*a*, a pair of leads for the temperature sensor 21*b*, a pair of leads for the voltage sensor 21*c*, and a pair of leads for the voltage sensor 21*d*.

The voltage sensor 21*c* includes an electrode pad arranged on a collector of the power semiconductor element 211 and an electrode pad arranged on an emitter of the power semiconductor element 211. Those electrode pads are each connected to a pair of leads among the plurality of signal leads 219 by wire bond wiring.

The plurality of signal leads 219 are connected to the control unit 40 via wiring members external to the first semiconductor module 21. As a result, the control unit 40 can acquire the sensor position temperature Ts and the inter-terminal voltage Vce of the detection target element, and can control the operation of the power semiconductor elements 211 to 214.

The first semiconductor module 21 also includes a mold resin 21*m*. The mold resin 21*m* entirely covers the power semiconductor elements 211 to 214, the temperature sensors 21*a* and 21*b*, the voltage sensors 21*c* and 21*d*, and the plurality of inner leads 215. Further, the mold resin 21*m* covers the P lead 216, the N lead 217, the AC lead 218, and the plurality of signal leads 219 except for one end portion of each of those leads.

The structure of the second semiconductor module 22 and the structure of the third semiconductor module 23 are the same as the structure of the first semiconductor module 21, and thus description thereof is omitted here.

Figure 4:
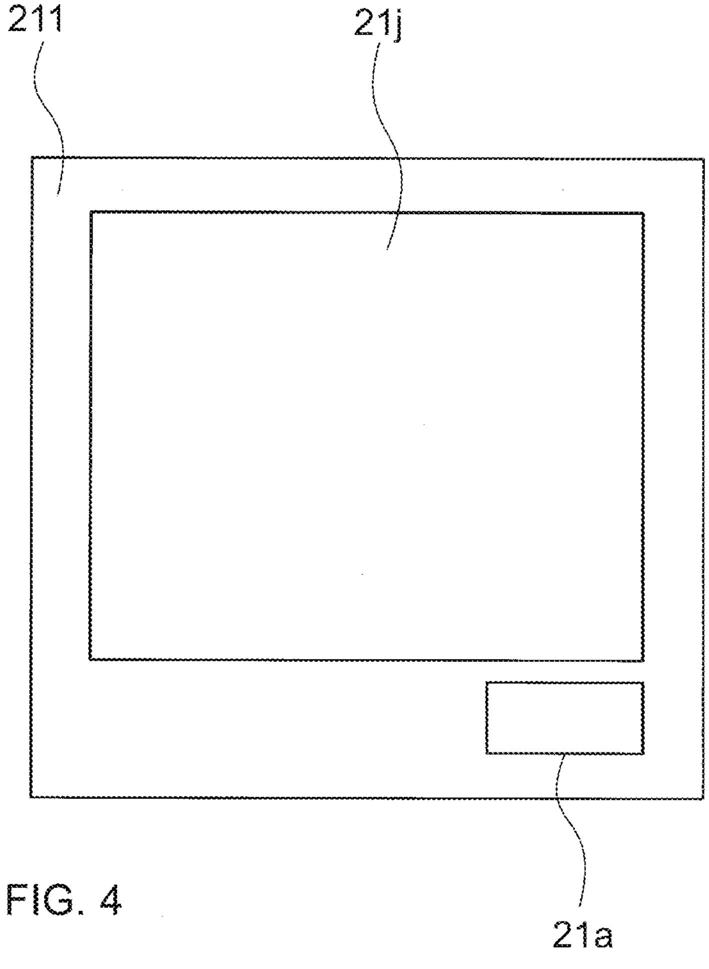
FIG. 4 is a top view for illustrating a position at which a temperature sensor is placed on a detection target element of FIG. 1.

FIG. 4 is a top view for illustrating a position at which the temperature sensor is placed on the detection target element of FIG. 1. Here, description is given of the power semiconductor element 211 as an example of the detection target element. A joining portion 21*j* with the inner leads 215 is arranged at the center of the upper surface of the power semiconductor element 211. The joining portion 21*j* with the inner leads 215 is formed of a conductive metal member. The temperature sensor 21*a* is arranged at a peripheral portion of the upper surface of the power semiconductor element 211. The peripheral portion is a portion on the upper surface of the power semiconductor element 211 which is closer to an outer side than the joining portion 21*j* with the inner leads 215.

Incidentally, the power semiconductor element 211 has the structure in which a large number of fine switches are formed in a cell shape or a striped shape on the surface of the power semiconductor element 211. The large number of fine switches are connected in parallel to each other. When the power semiconductor element 211 is in an on state, the electric power supplied to the power semiconductor element 211 is supplied by distributing the electric power among the large number of fine switches. At this time, the electric power tends to be distributed such that more electric power tends to be supplied to the fine switches that are closer to the center of the power semiconductor element 211.

Electric power is supplied to the fine switches formed at the position of the joining portion 21*j* from the inner leads 215 via a surface electrode layer formed on the element surface. In contrast, for the fine switches formed on the peripheral portion, electric power is supplied from the inner leads 215 via the surface of the surface electrode. The surface resistance of the surface electrode increases in accordance with the distance from the inner leads 215, and thus when the fine switches are farther from the inner leads 215, the electric power that is supplied is reduced.

Further, when there are more parallel fine switches, the on-resistance per unit area of the power semiconductor element 211 becomes smaller, and thus the loss of the power semiconductor element 211 is reduced. Therefore, by arranging the temperature sensor 21*a* as far away from the center of the power semiconductor element 211 as possible and making the mounting area of the temperature sensor 21*a* as small as possible, an increase in the temperature of the power semiconductor element 211 is reduced.

The power semiconductor element 213, which is another one of the detection target elements of the first semiconductor module 21, has the same configuration as that of the power semiconductor element 211, and thus description thereof is omitted here.

Further, even when a power semiconductor element 212 that does not have a temperature sensor 21*a* has the same chip outline as that of the power semiconductor element 211 which is the detection target element, the number of fine switches that are in parallel can be more than that for the detection target element. Therefore, the power semiconductor element 212 can supply more electric power than the power semiconductor element 211. As a result, the power semiconductor element 212 can further reduce conduction loss.

Figure 5:
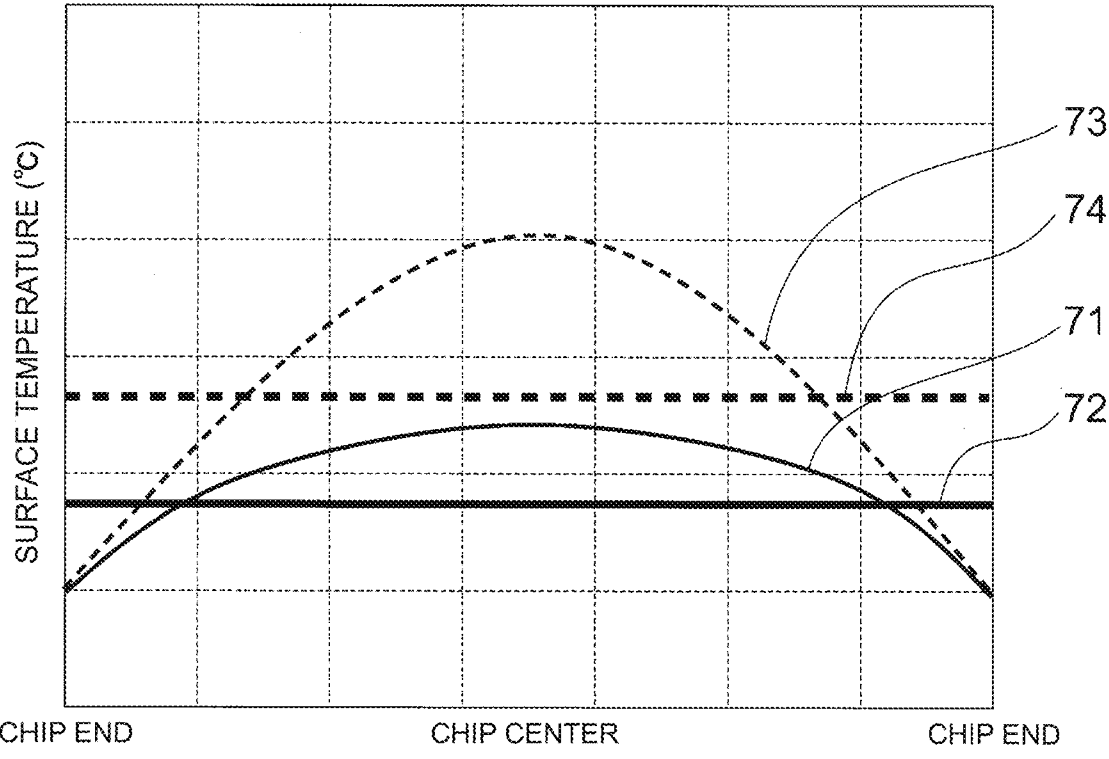
FIG. 5 is a graph for showing an in-plane distribution and an average temperature of a surface temperature of the detection target element of FIG. 1.

FIG. 5 is a graph for showing an in-plane distribution and an average temperature of the surface temperature of the detection target element of FIG. 1. Here, description is given of the power semiconductor element 211 as an example of the detection target element. The in-plane distribution of the surface temperature of the power semiconductor element 211 is indicated by a solid line 71. The in-plane distribution of the surface temperature of the power semiconductor element 211 shows the same tendency as that of the power distribution of the power semiconductor element 211. Therefore, as the distance to the center of the power semiconductor element 211 becomes closer, the surface temperature of the power semiconductor element 211 becomes higher. The average temperature of the surface of the power semiconductor element 211 with respect to that in-plane distribution of the surface temperature is indicated by a solid line 72.

A dashed line 73 indicates the in-plane distribution of the surface temperature of the power semiconductor element 211 when electric power is supplied to the power semiconductor element 211 not via the inner leads 215 but via the wire bond wiring. Further, a dashed line 74 indicates the average temperature of the surface of the power semiconductor element 211 when electric power is supplied to the power semiconductor element 211 by wire bond wiring. The cross-sectional area and the surface area of the wire bond wiring that is temporarily used are smaller than the cross-sectional area and the surface area of the inner leads 215.

As can be seen from FIG. 5, the shape of the solid line 71 is flatter than the shape of the dashed line 73. This is because the inner leads 215 are connected to the whole of the joining portion 21*j* at the center of the upper surface of the power semiconductor element 211, which means that the surface area connected to the joining portion 21*j* is large relative to the wire bond wiring, and because the inner leads 215 are arranged without gaps. Further, even when the temperature of the power semiconductor element 211 is rising, the flat in-plane distribution of the surface temperature of the power semiconductor element 211 is maintained because the inner leads 215 act as a heat mass.

Further, the in-plane position of the intersection between the solid line 71 and the solid line 72 is farther from the center of the power semiconductor element 211 than the in-plane position of the intersection between the dashed line 73 and the dashed line 74. This is because the in-plane distribution of the surface temperature of the power semiconductor element 211 has been flattened. Thus, even when the temperature sensor 21*a* is arranged on the peripheral portion of the power semiconductor element 211, a temperature closer to the average temperature of the power semiconductor element 211 is obtained by the temperature sensor 21*a*.

That is, using the inner leads 215 as a wiring member means that, even when the temperature sensor 21*a* is arranged closer to the periphery of the power semiconductor element 211, a value closer to the average temperature of the power semiconductor element 211 can be obtained by the temperature sensor 21*a*. As a result, it becomes possible to arrange more fine switches in the center of the surface of the power semiconductor element 211, and the on-resistance Ron of the power semiconductor element 211 is reduced, and thus the performance of the power semiconductor element can be improved.

The power semiconductor element 213, which is another one of the detection target elements of the first semiconductor module 21, has the same configuration as that of the power semiconductor element 211, and thus description thereof is omitted here.

Figure 6:
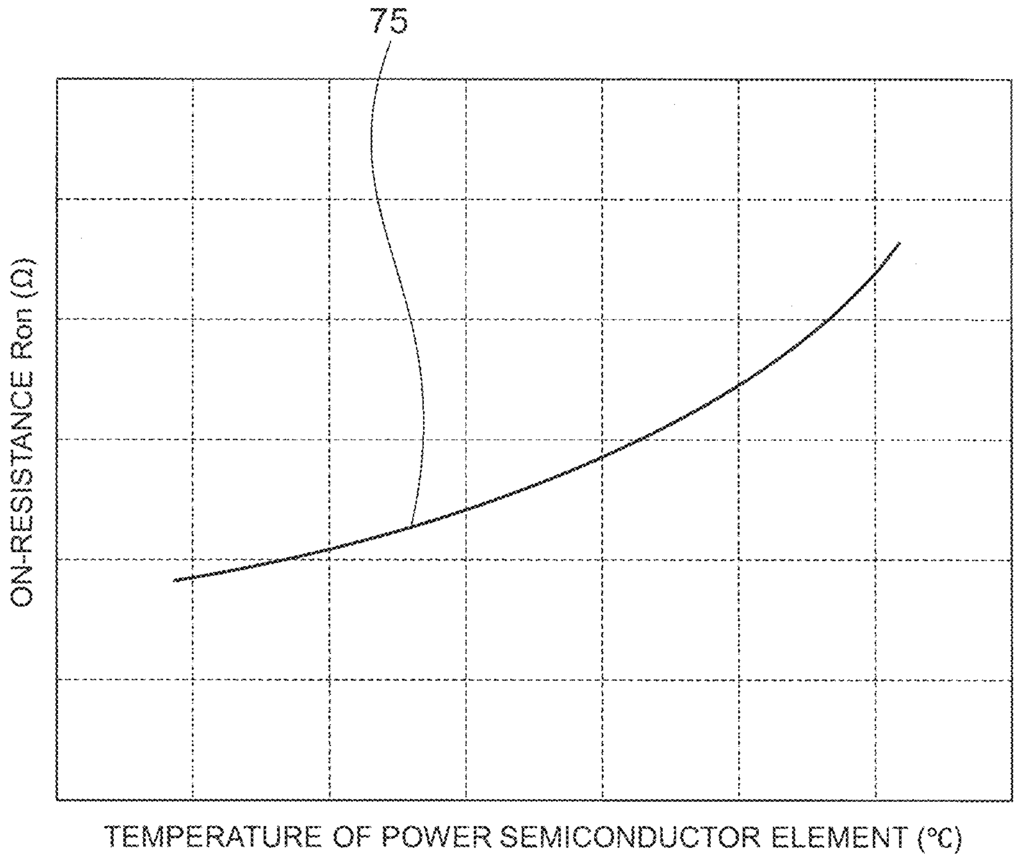
FIG. 6 is a graph for showing a relationship between an average temperature of a surface of a power semiconductor element of FIG. 1 and an on-resistance.

FIG. 6 is a graph for showing a relationship between the average temperature of the surface and the on-resistance Ron of the detection target element of FIG. 1. Here, description is given of the power semiconductor element 211 as an example of the detection target element. A temperature characteristic of the on-resistance Ron given when the average temperature of the power semiconductor element 211 is assumed as the element temperature is indicated by a curve 75. As shown in FIG. 6, the on-resistance Ron of the power semiconductor element 211 has a characteristic of increasing as the surface temperature of the power semiconductor element 211 increases. Therefore, the on-resistance Ron of the power semiconductor element 211 is calculated based on the temperature detected by the temperature sensor 21*a*.

The accuracy of the calculated value of the on-current Ion of the power semiconductor element 211 is also improved by calculating the on-resistance Ron based on the average temperature of the surface of the power semiconductor element 211. This is because the on-current Ion calculated by using the average temperature of the surface of the power semiconductor element 211 is the closest value to the actual situation.

The on-current Ion is calculated from the calculated on-resistance Ron and the inter-terminal voltage Vce detected by the voltage sensor 21*c* in accordance with Ohm's law.

The power semiconductor element 213, which is another one of the detection target elements of the first semiconductor module 21, has the same configuration as that of the power semiconductor element 211, and thus description thereof is omitted here.

A second current value, which is the value of the electric current flowing through the power semiconductor elements 212 and 214 that are not detection target elements, is determined as follows. The loss calculation unit 44 calculates the second current value for the power semiconductor element 212 by subtracting the first current value for the power semiconductor element 211 from the phase current of the U-phase calculated based on the signal from the U-phase phase current sensor 31.

The loss calculation unit 44 calculates the loss of the power semiconductor element 212 by applying the second current value, the power factor of the power semiconductor element 212, and the modulation factor of the power semiconductor element 212 to the second map for the power semiconductor element 212. The maximum temperature estimation unit 45 estimates the maximum temperature Tj max of the power semiconductor element 212 based on the loss of the power semiconductor element 212 calculated by the loss calculation unit 44.

Figure 7:
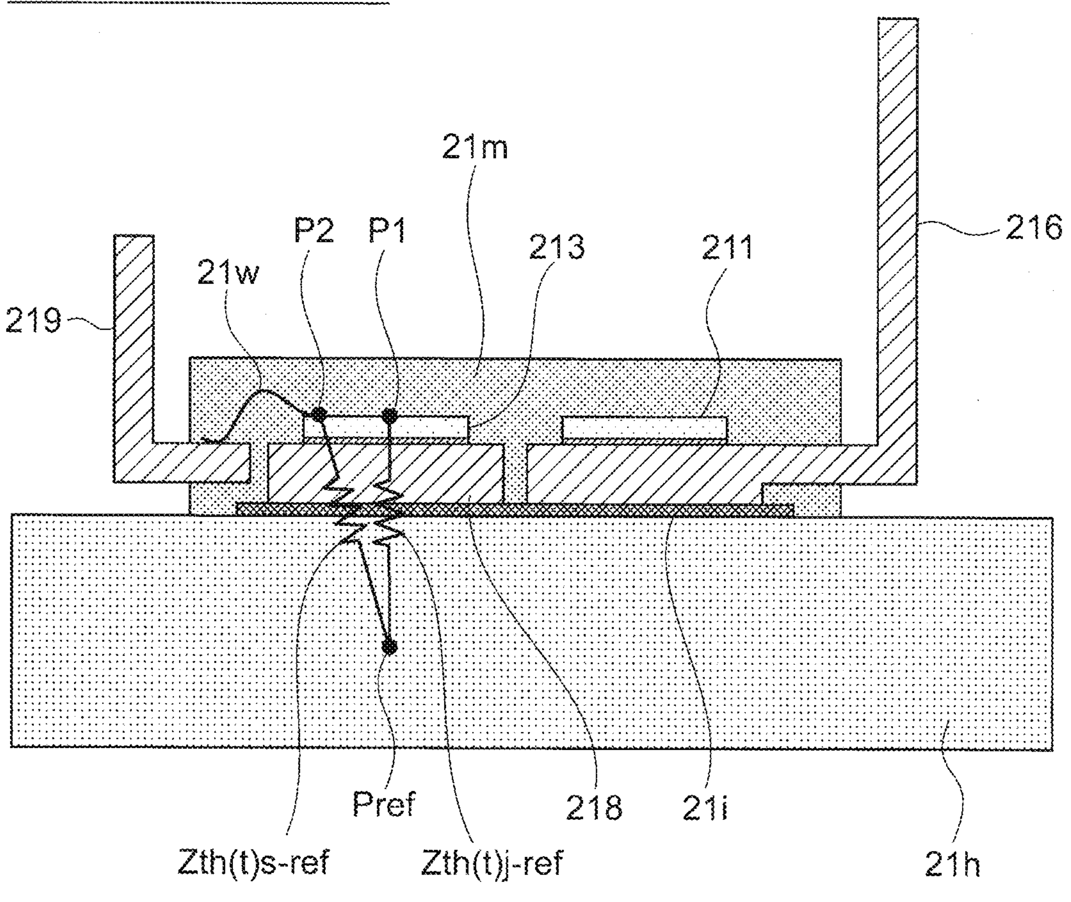
FIG. 7 is a cross-sectional view taken along the line A-A of FIG. 3 for illustrating the structure of the first semiconductor module of FIG. 1.

FIG. 7 is a cross-sectional view taken along the line A-A of FIG. 3 for illustrating the structure of the first power semiconductor module. The surface of the P lead 216 opposite to the surface on which the power semiconductor element 211 is mounted, and the surface of the AC lead 218 opposite to the surface on which the power semiconductor element 213 is mounted, are connected to a heat sink 21*h* serving as a cooler via an insulating member 21*i*. The heat sink 21*h* may be an air-cooled heat sink or a water-cooled heat sink. A control signal to the power semiconductor element 213 is sent to the power semiconductor element 213 from the signal lead 219 via a wire bond wiring 21*w*.

The thermal resistance between the maximum temperature position P1 and the reference position Pref is the first thermal resistance Zth(t)j-ref. The thermal resistance between the sensor temperature position P2 and the reference position Pref is the second thermal resistance Zth(t)s-ref. Heat generated on the surface of the power semiconductor element 213 due to electric power being supplied to the sensor temperature position P2 is dissipated to the heat sink 21*h* via the AC lead 218 and the insulating member 21*i*. Further, heat generated on the surface of the power semiconductor element 211 due to the supply of electric power is dissipated to the heat sink 21*h* via the P lead 216 and the insulating member 21*i*.

Figure 8:
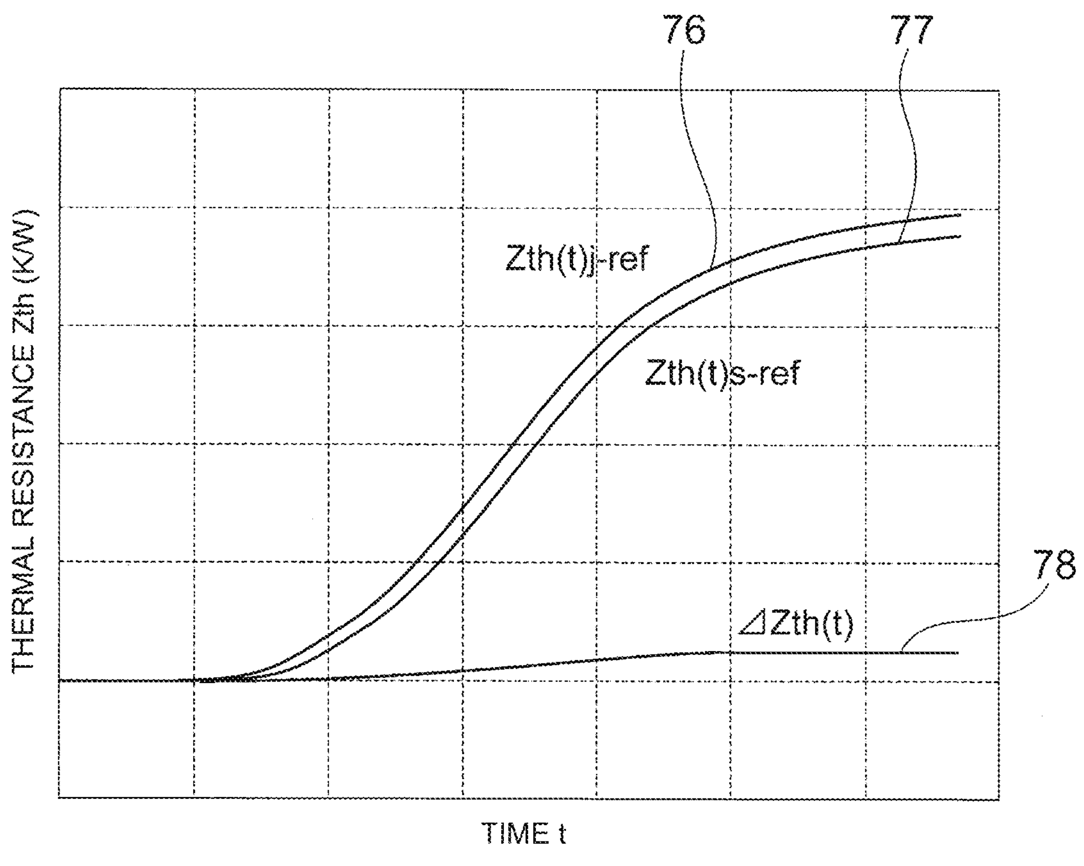
FIG. 8 is a graph for showing changes in thermal resistances and a change in a thermal resistance difference with respect to a power supply time.

FIG. 8 is a graph for showing changes in thermal resistance and a change in a thermal resistance difference function ΔZth(t) with respect to a power supply time "t". The first thermal resistance Zth(t)j-ref and the second thermal resistance Zth(t)s-ref are measured in advance at the design stage of the power conversion device 10 by using a power semiconductor module on which a power semiconductor element having typical characteristics is mounted. As another example, the first thermal resistance Zth(t)j-ref and the second thermal resistance Zth(t)s-ref are measured in advance for each power semiconductor element on the production line of the power conversion device 10.

More specifically, the first thermal resistance Zth(t)j-ref and the second thermal resistance Zth(t)s-ref are determined as follows. First, electric power is supplied to the power semiconductor elements 211 to 214 in a state in which the power semiconductor elements 211 to 214 are incorporated in the first semiconductor module 21. Next, the temperature at the maximum temperature position P1 of the power semiconductor element 213 with respect to the reference position Pref and the temperature at the sensor temperature position P2 detected by the temperature sensor 21*b* are simultaneously measured. Then, each measured temperature is divided by the loss with respect to the electric power supplied to the first semiconductor module 21.

The thermal resistance difference function ΔZth(t), which is the difference between the first thermal resistance Zth(t) j-ref and the second thermal resistance Zth(t)s-ref, is obtained by calculating at regular intervals the difference in thermal resistance obtained by subtracting the second thermal resistance Zth(t)s-ref from the first thermal resistance Zth(t)j-ref.

The maximum temperature estimation unit 45 stores in advance the thermal resistance difference function ΔZth(t). The maximum temperature estimation unit 45 calculates the temperature increase value ΔT corresponding to the thermal resistance difference function ΔZth(t) based on the thermal resistance difference function ΔZth(t), the power supply time "t", and the calculated real-time loss. The temperature increase value ΔT is determined by multiplying the thermal resistance difference function ΔZth(t) and the integrated loss.

The thermal resistance difference function ΔZth(t) is calculated from the difference between the maximum temperature position P1 with respect to the reference position Pref and the sensor temperature position P2 detected by the temperature sensor 21*b*, and thus the temperature increase value ΔT is the temperature difference between the maximum temperature position P1 and the sensor temperature position P2 detected by the temperature sensor 21*b*. Therefore, the maximum temperature Tj max of the power semiconductor element 213 can be determined by adding the temperature increase value ΔT to the temperature detected by the temperature sensor 21*b*.

The power semiconductor element control unit 46 adjusts the electric power supplied to the motor 60 so that the maximum temperature Tj max does not exceed a specified temperature. The specified temperature is the upper limit element temperature at which the power semiconductor element does not break down due to heat generation. Therefore, when the maximum temperature Tj max exceeds the specified temperature, the power semiconductor element control unit 46 can maintain the surface temperature of the power semiconductor element 213 at or below the specified temperature by limiting the electric power to be supplied.

For example, for an in-vehicle power conversion device, operation of supplying a large amount of electric power for a short time and operation of supplying a relatively moderate amount of electric power for a relatively long time are required. In the power conversion device 10 according to the first embodiment, the maximum temperature Tj max of the power semiconductor element is calculated by using the thermal resistance difference function ΔZth(t), and thus it is possible to meet the above-mentioned requirements.

In FIG. 8, a curve 76 indicates the first thermal resistance Zth(t)j-ref, a curve 77 indicates the second thermal resistance Zth(t)s-ref, and a curve 78 indicates the thermal resistance difference function ΔZth(t). As can be seen from FIG. 8, the first thermal resistance Zth(t)j-ref and the second thermal resistance Zth(t)s-ref increase as the power supply time "t" elapses, but as the power supply time "t" progresses, the increase is gradually saturated. In FIG. 8, the right side of each curve represents a state in which the increase in thermal resistance has been saturated.

When the thermal resistance is measured only in the state in which the increase has been saturated, and the temperature of the power semiconductor element is estimated by using the thermal resistance measured in the state in which the increase has been saturated, the estimated value of the thermal resistance is higher than the actual value because during the initial stage of electric power being supplied, the increase in thermal resistance has not yet been saturated. In this case, the maximum temperature Tj max of the power semiconductor element is perceived to be too high relative to the actual temperature, and hence the power output by the power conversion device 10 is reduced even though it is not required to be reduced.

However, in the power conversion device 10 according to the first embodiment, the thermal resistance difference function $\Delta Zth(t)$ is defined as a function of the power supply time "t," and hence, even during the initial stage of electric power being supplied, the estimated value of the thermal resistance is the actual value. Therefore, even when a large amount of electric power is supplied for a short time, the maximum temperature Tj max of the power semiconductor element is estimated correctly.

In the power conversion device 10 according to the first embodiment, the maximum temperature Tj max of the power semiconductor element is determined from the thermal resistance difference function $\Delta Zth(t)$, and not from the first thermal resistance Zth(t)j-ref and the second thermal resistance Zth(t)s-ref, which are each a thermal resistance with respect to a given reference position Pref.

That is, the reference position Pref set when the first thermal resistance Zth(t)j-ref and the second thermal resistance Zth(t)s-ref are determined does not directly affect the temperature increase value $\Delta T$ calculated when the power conversion device 10 actually operates. Therefore, for example, even when the power conversion device 10 is installed near an in-vehicle engine and heat from the engine is received as a disturbance in the actual heat dissipation path, the calculated maximum temperature Tj max is not affected by the disturbance.

This point is a substantial difference from the related-art method of calculating the maximum temperature of a power semiconductor element simply by using the thermal resistance measured in advance. Therefore, even when there is a high-temperature heat source in the surroundings, it is not required to set an excessively wide temperature margin in order to suppress the maximum temperature of the power semiconductor element to a specified temperature or less.

Figure 9:
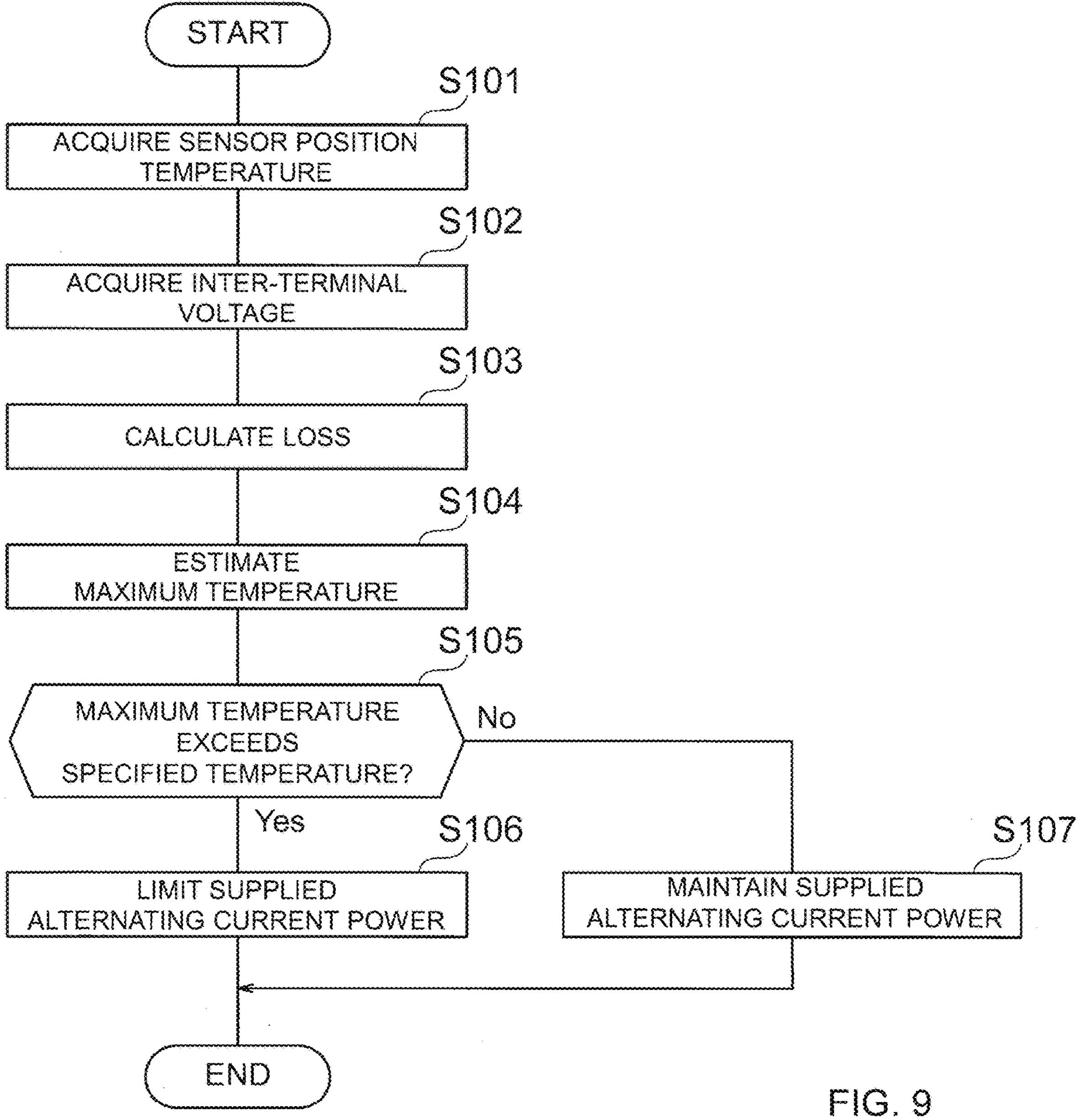
FIG. 9 is a flow chart for illustrating a maximum temperature estimation routine executed by the control unit of FIG. 1.

FIG. 9 is a flow chart for illustrating a maximum temperature estimation routine executed by the control unit 40 of FIG. 1. The routine of FIG. 9 is executed, for example, each time a fixed length of time elapses. When the routine of FIG. 9 is started, in Step S101, the control unit 40 acquires the sensor position temperature Ts from the temperature sensor arranged in the detection target element.

Next, in Step S102, the control unit 40 acquires the inter-terminal voltage Vce from the voltage sensor arranged in the detection target element.

Next, in Step S103, the control unit 40 calculates the loss of the detection target element based on the acquired sensor position temperature Ts and the acquired inter-terminal voltage Vce.

Next, in Step S104, the control unit 40 estimates the maximum temperature of the detection target element based on the calculated loss.

Next, in Step S105, the control unit 40 determines whether or not the estimated maximum temperature exceeds the specified temperature. When the estimated maximum temperature exceeds the specified temperature, in Step S106, the control unit 40 causes the power conversion unit 20 to limit the alternating current power supplied to the motor 60, and temporarily ends this routine.

Meanwhile, when the estimated maximum temperature does not exceed the specified temperature, in Step S107, the control unit 40 causes the power conversion unit 20 to maintain the alternating current power supplied to the motor 60, and temporarily ends this routine.

Figure 10:
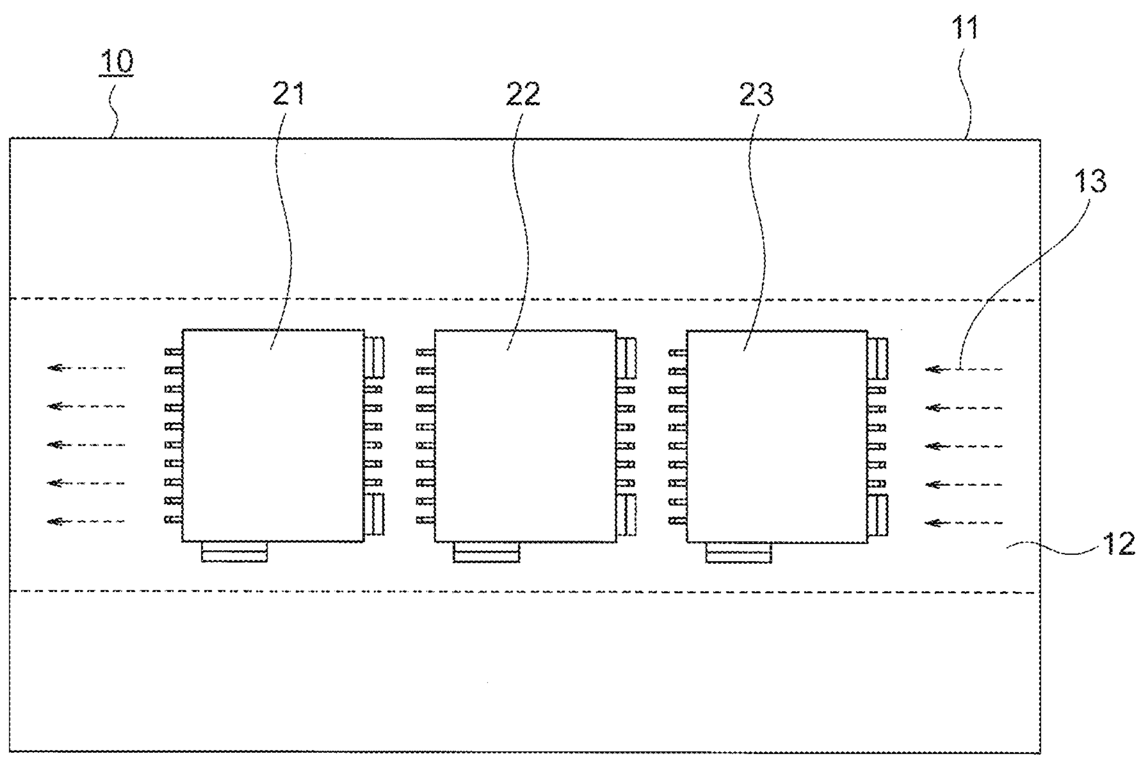
FIG. 10 is a schematic diagram for illustrating the power conversion device of FIG. 1 mounted on a cooler.

FIG. 10 is a schematic diagram for illustrating the power conversion device of FIG. 1 mounted on a cooler. The first semiconductor module 21, the second semiconductor module 22, and the third semiconductor module 23 all have the same configuration. The cooler 11 has a cooling path 12 along which refrigerant flows. Arrows 13 indicate the flow direction of the refrigerant. That is, the refrigerant flows along the cooling path 12 from right to left in the drawing sheet. The first semiconductor module 21, the second semiconductor module 22, and the third semiconductor module 23 are arranged side by side on the upper surface of the cooler 11 in the flow direction of the refrigerant.

Thus, by using the identical power semiconductor modules, production costs can be reduced more than by combining different types of power semiconductor modules. This is because the types of molds and the types of parts required for producing the power semiconductor module can be reduced. Further, by arranging identical power semiconductor modules side by side, the inductance component of the wiring between the power semiconductor modules can be reduced. As a result, it is possible to reduce a surge voltage generated in the power semiconductor element and reduce the switching loss.

When the power semiconductor modules are arranged side by side, only one cooling path for the cooler is required to be set, and it is possible to suppress a decrease in yield caused by an increase in the size of the cooler and an increase in the difficulty of manufacturing the cooler.

When a plurality of power semiconductor modules are arranged along the flow direction of the refrigerant, a cooling capacity of the power semiconductor modules arranged downstream in the flow direction of the refrigerant is less than a cooling capacity of the power semiconductor modules arranged upstream in the flow direction of the refrigerant. This is because, on the upstream side of the cooling path, the heat of the power semiconductor modules is released into the refrigerant so that the temperature of the refrigerant increases, the temperature difference between the cooler and the refrigerant on the downstream side decreases, and as a result, the amount of heat transferred from the cooler to the refrigerant decreases.

Here, there is now considered a case in which the maximum temperature of the power semiconductor element is calculated by using a reference temperature at a reference position set for the cooler instead of using the thermal resistance difference function $\Delta Zth(t)$. In this case, even when the temperature of the power semiconductor elements at positions close to the reference position can be measured correctly, for the power semiconductor elements at positions further away from the reference position, the temperature measurement error becomes larger.

Therefore, in the method using the reference temperature, in order to accurately measure the temperature of the power semiconductor elements, it is required to set a reference position for each power semiconductor element and arrange a temperature sensor for measuring the temperature at that reference position.

However, in order to ensure heat dissipation properties and reduce thermal resistance, the power semiconductor elements and the cooler are connected without gaps by a member having high thermal conductivity. Therefore, it is difficult to set the reference position directly below the power semiconductor elements, and it is inevitable to arrange the power semiconductor elements and the reference position separated from each other.

Meanwhile, in the power conversion device 10 according to the first embodiment, when the maximum temperature Tj max is calculated, the thermal resistance difference function ΔZth(t) between the sensor temperature position and the maximum temperature position is used instead of the thermal resistance calculated from a certain fixed reference position. Therefore, with the power conversion device 10 according to the first embodiment, the maximum temperature Tj max can be accurately calculated even when the temperature change at the reference position and the heat dissipation path to the reference position are affected by disturbance.

In Patent Literature 1, there is no description of a method of estimating a transient temperature change of a power semiconductor element, or of a method of estimating the maximum temperature of a power semiconductor element. Further, the temperature sensor is arranged at a position away from the maximum temperature of the power semiconductor element, and the detected value of the temperature sensor is used as the temperature of the power semiconductor element. Therefore, there is a difference between the value detected by the temperature sensor and the maximum temperature of the power semiconductor element. In order to prevent the maximum temperature of the power semiconductor element from exceeding a permissible temperature, an excessively wide temperature margin is required.

Further, in Patent Literature 1, the voltage between the main terminals is measured, and thus, in a configuration in which a plurality of power semiconductor elements are connected in parallel, is not possible to take into account a distribution ratio of the electric current flowing through each power semiconductor element. Therefore, when a plurality of power semiconductor elements are connected in parallel, the plurality of power semiconductor elements connected in parallel are treated as having the same amount of generated heat, which reduces the accuracy of the detected maximum temperature of the power semiconductor elements. Therefore, an even more excessively wide temperature margin is required.

In addition, the value of the electric current which actually flows through the motor 60 is often determined by the drive torque required of the motor 60 and the required value of the power generation output, and in reality, the temperature is estimated based on changes in the drive voltage value. However, the temperature characteristics of the on-resistance Ron of a power semiconductor element are generally inferior to those of the temperature detection including element, diodes and thermistors.

Meanwhile, in the power conversion device 10 according to the first embodiment, in order to handle the downsizing and higher output of devices, a real-time loss is calculated for each power semiconductor element connected in parallel inside the power semiconductor module. As a result, the maximum temperature Tj max of the power semiconductor elements corresponding to the power supply time can be accurately calculated. In this case, it is not required to arrange a current sensor, and thus it is possible to suppress an increase in the size of the power conversion device 10 and an increase in the cost of parts.

Further, the power conversion device 10 includes three current value calculation means, namely, means for calculating a first current value, means for calculating a second current value, and the phase current sensor 30. Therefore, in the unlikely event that a problem occurs in the phase current sensor 30, the phase current can be calculated by multiplying the first current value calculated by the first current value calculation means by two, and the obtained value can be used as a substitute value for the output of the phase current sensor. As a result, redundancy can be provided to the detection of the phase current.

As described above, the power conversion device 10 according to the first embodiment includes the first semiconductor module 21, the second semiconductor module 22, and the third semiconductor module 23. The first semiconductor module 21, the second semiconductor module 22, and the third semiconductor module 23 include a plurality of power semiconductor elements 211 to 214, 221 to 224, and 231 to 234, respectively.

Further, the power conversion device 10 includes the power conversion unit 20 and the control unit 40. The power semiconductor elements 211, 213, 221, 223, 231, and 233 are the detection target elements for which a temperature is to be detected. The power conversion unit 20 further includes the temperature sensors **21*a*, 21*b*, 22*a*, 22*b*, 23*a*, and 23*b* and the voltage sensors 21*c*, 21*d*, 22*c*, 22*d*, 23*c*, and 23*d*. The temperature sensors 21*a*, 21*b*, 22*a*, 22*b*, 23*a*, and 23*b* each detect the surface temperature of the detection target element as the sensor position temperature Ts. The voltage sensors 21*c*, 21*d*, 22*c*, 22*d*, 23*c*, and 23*d*** each detect the inter-terminal voltage Vce of the detection target element.

The control unit 40 calculates, when the position at which the temperature is highest on the surface of the detection target element is defined as a maximum temperature position, a loss in the detection target element based on the sensor position temperature Ts and the inter-terminal voltage Vce, and estimates a maximum temperature based on the calculated loss. The maximum temperature is the temperature at the maximum temperature position.

Thus, the loss of the detection target element is immediately calculated based on the detected sensor position temperature Ts and the detected inter-terminal voltage Vce, and thus the maximum temperature of the detection target element is also estimated immediately. Therefore, for example, even when the operation of the power conversion device 10 is an operation such as supplying a large amount of electric power to a motor in a relatively short period of time, the temperature of the power semiconductor element is prevented from being estimated to be higher than the actual temperature. As a result, it is possible to prevent the output of a power semiconductor element from being limited when it is not required to limit the output. That is, the power semiconductor elements can be protected from overheating more appropriately.

Further, the first semiconductor module 21 includes the upper arm 21U and the lower arm 21L. The plurality of power semiconductor elements 211, 212, 213, and 214 include the plurality of upper arm elements and the plurality of lower arm elements. The plurality of upper arm elements are included in the upper arm 21U, and are connected to each other in parallel. The plurality of lower arm elements are included in the lower arm 21L, and are connected to each other in parallel.

Specifically, only the power semiconductor element 211 which is one of the plurality of upper arm elements and only the power semiconductor element 213 which is one of the plurality of lower arm elements are each the detection target element.

Thus, the plurality of power semiconductor elements are connected in parallel to each other, and hence the electric power per power semiconductor element can be reduced, and the amount of heat generated per element can be reduced. Therefore, the power semiconductor element can be protected from overheating more appropriately. Further, even when only one detection target element is provided in each of the upper arm and the lower arm, the maximum temperature of the power semiconductor elements can be accurately estimated.

Further, the control unit 40 stores a relationship between the sensor position temperature Ts and an on-resistance Ron of the detection target element. The control unit 40 calculates the on-resistance Ron based on the sensor position temperature Ts, and calculates a first current value based on the calculated on-resistance Ron and the inter-terminal voltage Vce. The first current value is the value of the electric current flowing through the detection target element.

Thus, the on-resistance Ron is calculated based on the sensor position temperature Ts, and the first current value is calculated based on the calculated on-resistance Ron and the inter-terminal voltage Vce. Therefore, the first current value can be calculated more accurately and immediately.

In addition, the power conversion device 10 further includes the phase current sensor 30. The phase current sensor 30 detects a phase current, which is the electric current flowing through each phase of the motor 60. The number of upper arm elements is two, and the number of lower arm elements is two. The control unit 40 calculates a second current value by subtracting the first current value from the phase current. The second current value is the value of the electric current flowing through a power semiconductor element other than the detection target element among the plurality of power semiconductor elements.

Thus, the on-current flowing through a power semiconductor element other than the detection target element can be accurately calculated, and hence the maximum temperature of the power semiconductor elements can be estimated with higher accuracy.

Further, the number of upper arm elements is two, and the number of lower arm elements is two. The control unit 40 determines the phase current by multiplying the first current value by two.

Thus, the on-current flowing through a power semiconductor element other than the detection target element can be easily determined.

Further, the control unit 40 stores in advance a relationship of the first current value, the power factor of the detection target element, and the modulation factor of the detection target element with respect to the loss of the detection target element.

Thus, the loss occurring in the power semiconductor element can be immediately calculated for each power semiconductor element from the calculated first on-current and second on-current. As a result, the maximum temperature of the power semiconductor elements can be estimated with higher accuracy.

Further, the control unit 40 stores a thermal resistance difference function ΔZth(t). The thermal resistance difference function ΔZth(t) is a function of the difference between a first thermal resistance Zth(t)j-ref and a second thermal resistance Zth(t)s-ref with respect to a time for which the alternating current power is supplied to the motor 60. The first thermal resistance Zth(t)j-ref is the thermal resistance between the maximum temperature position and a reference position in the heat dissipation path of a first semiconductor module. The second thermal resistance Zth(t)s-ref is the thermal resistance between a sensor position and the reference position.

The sensor position is a position at which the sensor position temperature Ts is detected. The control unit 40 estimates the maximum temperature based on the detected sensor position temperature Ts, the calculated loss, and the stored thermal resistance difference function ΔZth(t), and when the estimated maximum temperature exceeds the specified temperature, causes the power conversion unit 20 to limit the alternating current power.

Thus, the reference position set when the first thermal resistance Zth(t)j-ref and the second thermal resistance Zth(t)s-ref are measured in advance does not directly affect the temperature increase value ΔT. Therefore, even when the power conversion device 10 is arranged close to, for example, an engine, a motor, or an exhaust section, and disturbance occurs in the heat dissipation path, the value of the maximum temperature Tj max is not affected by the disturbance. This means that even when a high-temperature heat source is present in the surroundings of the power conversion device 10, it is not required to set an excessively wide temperature margin in order to suppress the maximum temperature of the power semiconductor element to a specified temperature or less. As a result, the maximum temperature of the power semiconductor elements can be estimated with higher accuracy.

Further, the control unit 40 stores in advance the thermal resistance difference functions ΔZth(t) for all detection target elements.

Thus, the maximum temperature of the power semiconductor elements can be estimated with higher accuracy.

Further, the first semiconductor module 21 includes the P lead 216, the N lead 217, the AC lead 218, and the plurality of inner leads 215. The P lead 216, the N lead 217, and the AC lead 218 are each formed of a conductive metal member. The P lead 216, the N lead 217, and the AC lead 218 each have a mounting surface for mounting at least one of the plurality of power semiconductor elements or the plurality of inner leads 215. The lower surface of the plurality of power semiconductor elements is connected to a first power lead on the mounting surface among the P lead 216, the N lead 217, and the AC lead 218.

The plurality of inner leads 215 are each formed of a conductive metal member, and connect an upper surface, which is a surface opposite to the lower surface, and the mounting surface of a second power lead, which is a power lead different from the first power lead among the P lead 216, the N lead 217, and the AC lead 218. The joining portion **21*j* between the plurality of power semiconductor elements and the plurality of inner leads 215 is arranged at the center of the upper surface. The temperature sensor 21*a* is arranged on the upper surface at a peripheral portion which is closer to an outer side than the joining portion 21*j***.

Thus, the mounting density of power semiconductor elements in the power semiconductor module is improved, and hence even when the number of mounted power semiconductor elements is increased, it is possible to suppress an increase in the size of the power semiconductor module. In addition, by using the inner leads as a wiring member, it is possible to suppress an increase in the surface temperature of the power semiconductor elements.

Further, the power conversion device 10 further includes the cooler 11 for cooling the power semiconductor module by using refrigerant. A plurality of power semiconductor modules are arranged in the cooler 11 along a direction in which the refrigerant flows.

Thus, it is only required to arrange one cooling path. Therefore, compared to a case in which a plurality of cooling paths are arranged, the cooler can be made smaller and the cooler can be manufactured more easily.

In FIG. 3, of the two upper arm elements, the power semiconductor element 211, which is a detection target element, is arranged further toward an outer side of the first semiconductor module 21 than the power semiconductor element 212, which is not a detection target element, but the arrangement of the two upper arm elements is not limited to this arrangement. Similarly, among the two lower arm elements, the power semiconductor element 213, which is a detection target element, is arranged further an outer toward side of the first semiconductor module 21 than the power semiconductor element 214, which is not a detection target element, but the arrangement of the two lower arm elements is not limited to this arrangement. The same applies to the second semiconductor module 22 and the third semiconductor module 23.

Further, a thermistor is used as the temperature sensor, but the temperature sensor is not limited to a thermistor, and for example, any of a resistance temperature detector, a thermocouple, an IC temperature sensor, and temperature-sensitive ferrite may be used.

Further, in order to calculate the on-current Ion faster, the control unit 40 may have, instead of the first map and the second map, a fourth map in which a relationship of the sensor position temperature Ts and the inter-terminal voltage Vce with respect to the on-current Ion is defined in advance. In this case, the control unit 40 directly calculates the on-current Ion by applying the acquired sensor position temperature Ts and the acquired inter-terminal voltage Vce to the fourth map.

Further, two detection target elements may be arranged on each of the upper arm 21U and the lower arm 21L. In this case, it suffices that the on-current be calculated for any one of the two detection target elements of the upper arm 21U.

In FIG. 10, a water-cooled cooler is illustrated for convenience of description, but the cooler of the power conversion device 10 may be a cooler which uses refrigerant other than water or may be an air-cooled cooler.

Second Embodiment

Figure 11:
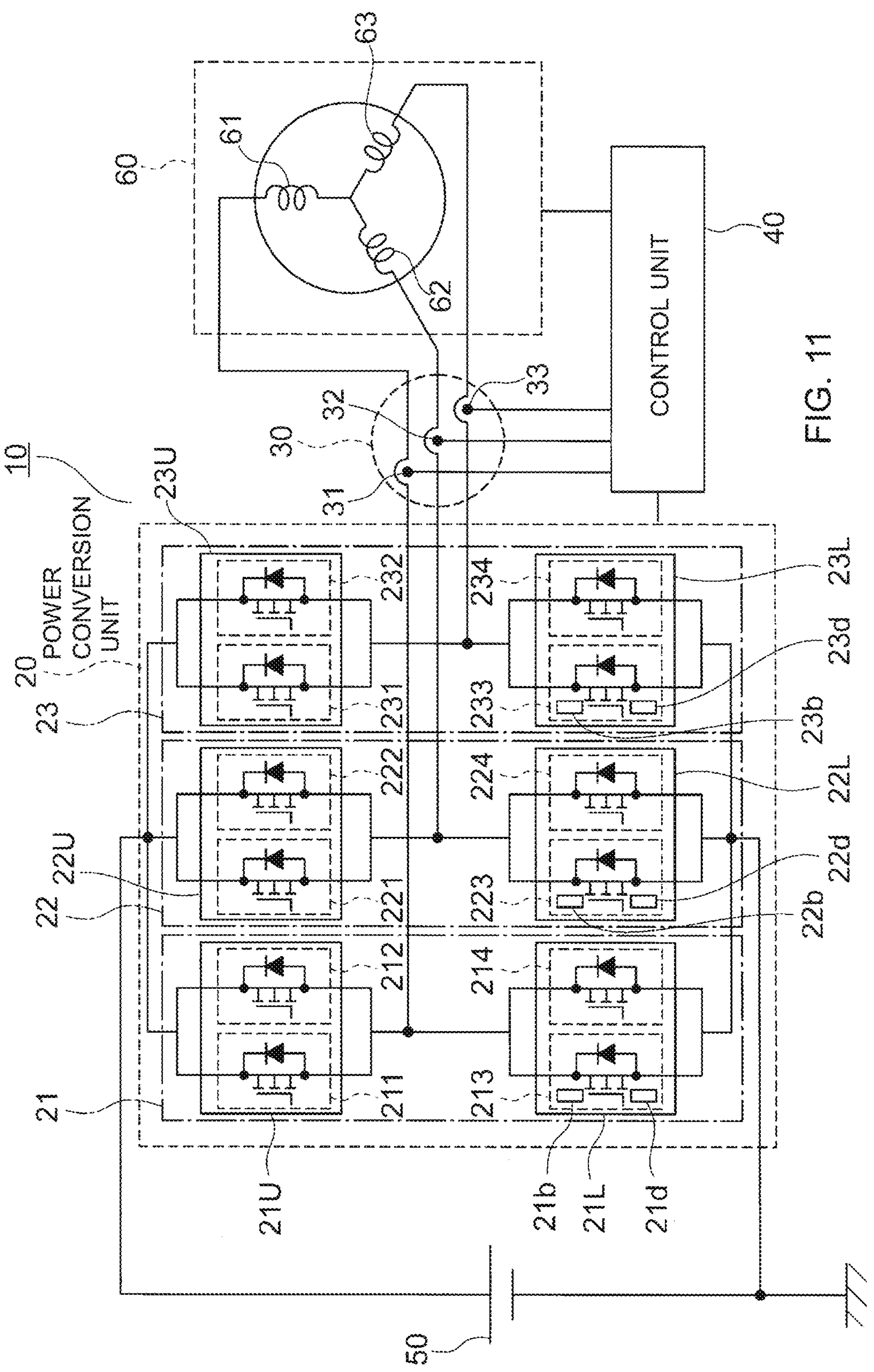
FIG. 11 is a configuration diagram for illustrating a power conversion device according to a second embodiment of the present disclosure, with a part of the power conversion device illustrated in the form of a block diagram.

Next, a power conversion device according to a second embodiment of the present disclosure is described. FIG. 11 is a configuration diagram for illustrating the power conversion device according to the second embodiment, with a part of the power conversion device illustrated in the form of a block diagram. A power conversion device 10 includes a power conversion unit 20, a phase current sensor 30, and a control unit 40.

In the power conversion device 10 of the second embodiment, the temperature sensor and the voltage sensor are arranged in any one of the power semiconductor elements of the lower arm of each phase. The configuration of the power conversion device 10 of the second embodiment is different from the configuration of the power conversion device 10 of the first embodiment in that the upper arm of each phase does not include the temperature sensor and the voltage sensor. The other points are the same as the configuration of the power conversion device 10 of the first embodiment.

In a case in which an even smaller and higher-output power conversion device is desired, even when a plurality of power semiconductor elements are connected in parallel inside a plurality of power semiconductor modules, it suffices to arrange the temperature sensor in only one of the power semiconductor modules. Therefore, it is not required to increase the number of temperature sensor wiring members and the number of circuits for calculating the temperature.

Figure 12:
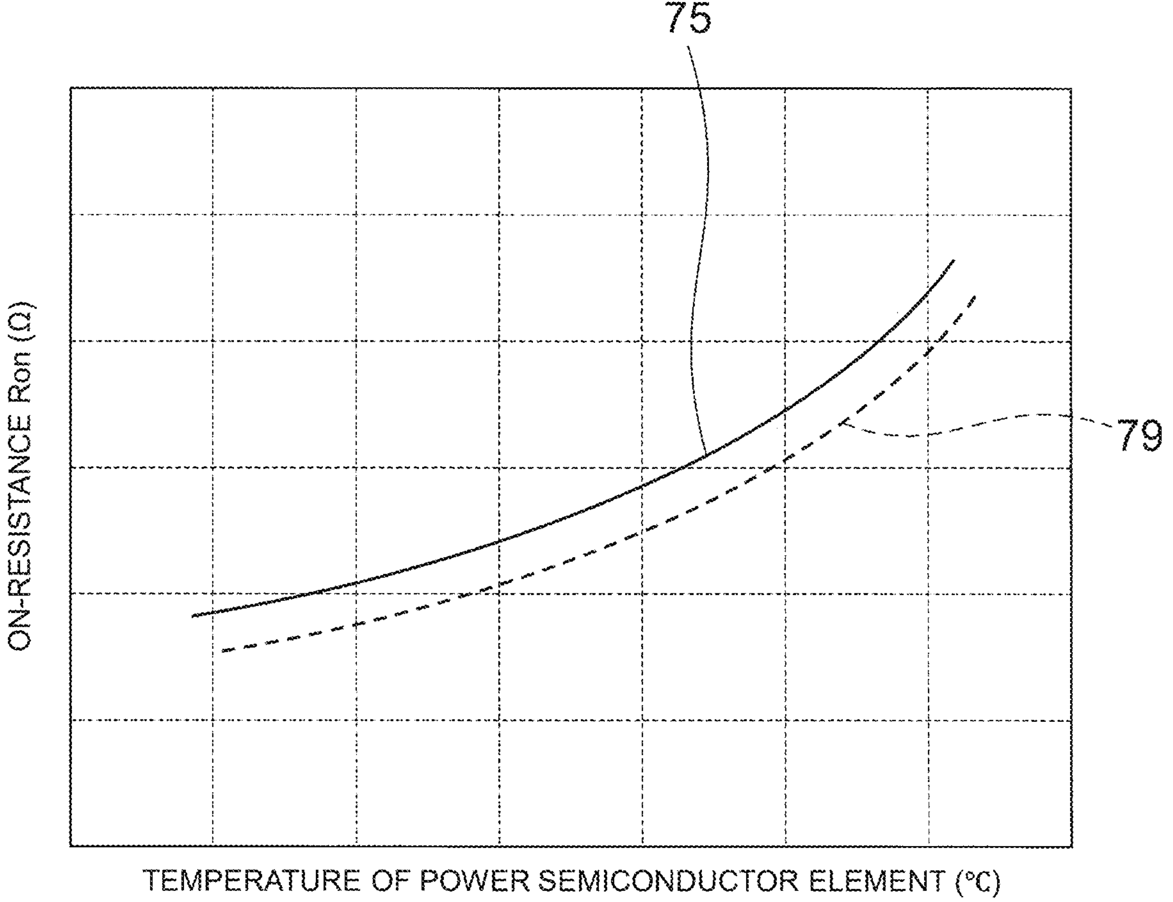
FIG. 12 is a graph for showing relationships between the temperature and the on-resistance of the detection target element of FIG. 11.

FIG. 12 is a graph for showing a relationship between the average temperature of the surface and the on-resistance Ron of the detection target element of FIG. 11. A temperature characteristic of the on-resistance Ron given when the average temperature of the power semiconductor element is assumed as the element temperature is indicated by the curve 75. A temperature characteristic of the on-resistance Ron given when the temperature detected by the temperature sensor is assumed as the element temperature is indicated by a curve 79.

A temperature sensor is arranged further toward a peripheral portion of the surface of the power semiconductor element so that the temperature detected by the temperature sensor shows a value lower than the actual average temperature of the power semiconductor element. As a result, the temperature detected by the temperature sensor is intentionally set to be lower than the average temperature of the power semiconductor element.

As shown in FIG. 12, there is a positive correlation between the temperature of the power semiconductor element and the on-resistance Ron. Therefore, when the temperature detected by the temperature sensor 21*a* is lower than the average temperature of the power semiconductor element, the on-resistance Ron is calculated as a value lower than the actual on-resistance Ron.

Further, an on-voltage Von is not directly affected by the position of the temperature sensor, and thus the on-voltage Von does not change compared to the configuration in the first embodiment. Therefore, the on-resistance Ron has a relatively low value with respect to the on-voltage Von. As a result, the on-current Ion is calculated as a value higher than the actual current value.

When the loss of the power semiconductor element is calculated by using an on-current Ion higher than the actual current value, the loss obtained by calculation is larger than the actual loss. The difference between the loss obtained by calculation and the actual loss is set as a loss margin. Power semiconductor elements having the same characteristics are used as the plurality of power semiconductor elements in the power semiconductor module. Thus, fluctuation in the loss caused by fluctuation in the value of the electric current flowing into the power semiconductor elements connected in parallel and differences in characteristics among the power semiconductor elements is suppressed to a level that is equal to or less than the set loss margin.

With the configuration of the power conversion device 10 of the second embodiment, the loss of the power semiconductor elements is determined in real time from the calculated on-current Ion. Similarly to the power conversion device 10 of the first embodiment, the maximum temperature Tj max of the power semiconductor elements can be determined based on the thermal resistance difference function $\Delta Zth(t)$ and the temperature detected by the temperature sensor 21*b*.

Further, the maximum temperature Tj max calculated by the present method becomes a value higher by the loss margin than the actual maximum temperature of the power semiconductor element, thereby preventing the temperature of the power semiconductor element from exceeding the specified temperature. Moreover, by taking into account the change in thermal resistance with respect to the power supply time "t", accurate protection from overheating becomes possible.

Thus, the number of power semiconductor elements connected in parallel can be increased without significantly increasing the number of temperature sensors. Therefore, the output of the power conversion device can be increased without significantly increasing the circuit scale.

Thus, in the power conversion device 10 according to the second embodiment, the first semiconductor module 21 includes the upper arm 21U and the lower arm 21L. The plurality of power semiconductor elements include a plurality of upper arm elements and a plurality of lower arm elements. The plurality of upper arm elements are included in the upper arm 21U and connected to each other in parallel. The plurality of lower arm elements are included in the lower arm 21L and connected to each other in parallel. Only one of the plurality of lower arm elements is a detection target element.

Thus, there is only one detection target element in the power semiconductor module, and there is also only one combination of the sensor position temperature Ts and the inter-terminal voltage Vce of the detection target, and hence the scale of the circuit for detecting the sensor position temperature Ts and the inter-terminal voltage Vce can be reduced. As a result, the size of the power conversion device 10 can be further reduced.

In addition, the position of the peripheral portion is a position at which the surface temperature detected by the temperature sensor 21*b* is lower than the in-plane average temperature on the surface of the detection target element.

Thus, when the temperature detected by the temperature sensor is intentionally assumed to be a lower temperature than the average temperature of the power semiconductor elements, due to the positive correlation between the temperature of the power semiconductor element and the on-resistance Ron, the on-resistance Ron is calculated as a lower value than the actual on-resistance Ron. Therefore, the loss obtained by calculation is larger than the actual loss, and the difference between the loss obtained by calculation and the actual loss can be set as a loss margin. As a result, the power semiconductor element can be protected from overheating more appropriately.

In the second embodiment, only one of the plurality of lower arm elements is the detection target element, but only one of the plurality of upper arm elements may be the detection target element. That is, it suffices that only one of the plurality of upper arm elements and the plurality of lower arm elements be the detection target element.

Further, in the first embodiment and the second embodiment, the detection target elements are some of the plurality of power semiconductor elements, but all of the plurality of power semiconductor elements may be detection target elements.

Further, in the first embodiment and the second embodiment, the temperature sensor and the voltage sensor are arranged in the detection target element, but the temperature sensor and the voltage sensor may be arranged in a power semiconductor element other than the detection target element. In this case, the control unit 40 may be configured to avoid acquiring signals from the temperature sensors and the voltage sensors arranged in the power semiconductor elements other than the detection target element. With this configuration, it is not required to mount different types of power semiconductor elements in one power conversion device 10, and thus the power conversion device 10 can be produced more easily.

Further, in the first embodiment and the second embodiment, the configuration of the first semiconductor module 21, the configuration of the second semiconductor module 22, and the configuration of the third semiconductor module 23 are all the same. Therefore, unless otherwise specified, the description regarding the first semiconductor module 21 also applies to the second semiconductor module 22 and the third semiconductor module 23.

Further, a metal oxide semiconductor field effect transistor (MOSFET) or a transistor may be used in each power semiconductor element instead of an IGBT.

Figure 13:
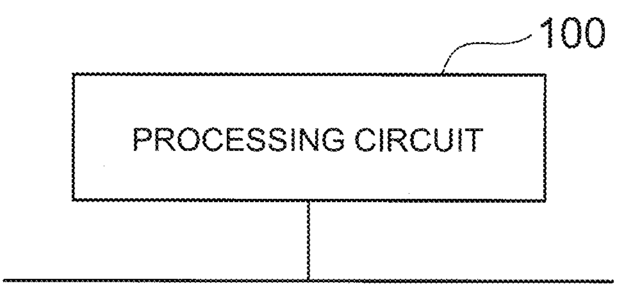
FIG. 13 is a configuration diagram for illustrating a first example of a processing circuit that implements functions of the power conversion devices according to the first embodiment and the second embodiment.

The functions of the power conversion devices 10 according to the first embodiment and the second embodiment are implemented by a processing circuit. FIG. 13 is a configuration diagram for illustrating a first example of a processing circuit that implements the functions of the power conversion devices 10 according to the first embodiment and the second embodiment. A processing circuit 100 of the first example is dedicated hardware.

The processing circuit 100 corresponds to, for example, a single circuit, a complex circuit, a programmed processor, a processor for a parallel program, an application specific integrated circuit (ASIC), a field programmable gate array (FPGA), or a combination thereof.

Figure 14:
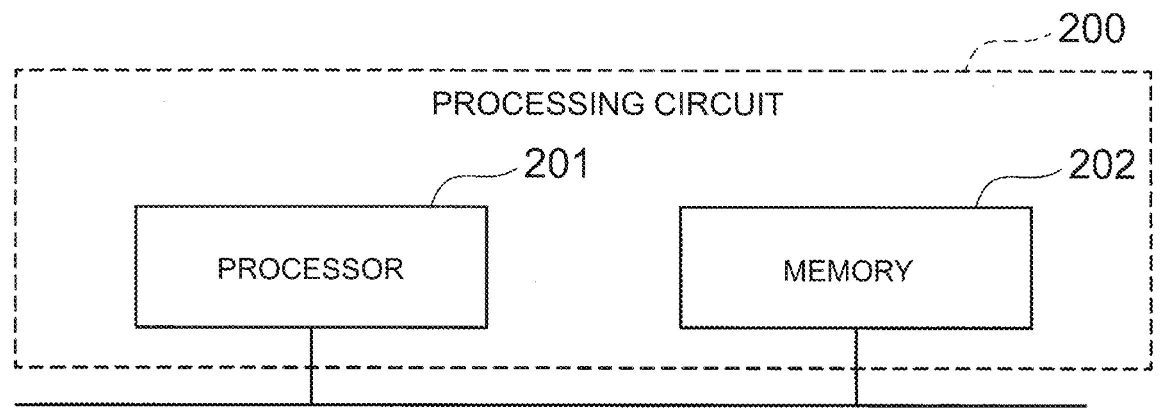
FIG. 14 is a configuration diagram for illustrating a second example of the processing circuit that implements the functions of the power conversion devices according to the first embodiment and the second embodiment.

FIG. 14 is a configuration diagram for illustrating a second example of the processing circuit that implements the functions of the power conversion devices 10 according to the first embodiment and the second embodiment. A processing circuit 200 of the second example includes a processor 201 and a memory 202.

In the processing circuit 200, the functions of the power conversion devices 10 are implemented by software, firmware, or a combination of software and firmware. The software and the firmware are described as programs to be stored in the memory 202. The processor 201 reads out and executes the programs stored in the memory 202, to thereby implement the functions.

The programs stored in the memory 202 can also be regarded as programs for causing a computer to execute the procedures or methods of each of the above-mentioned units. In this case, the memory 202 corresponds to, for example, a nonvolatile or volatile semiconductor memory, such as a random access memory (RAM), a read only memory (ROM), a flash memory, an erasable programmable read only memory (EPROM), or an electrically erasable and programmable read only memory (EEPROM). A magnetic disk, a flexible disk, an optical disc, a compact disc, a MiniDisc, or a DVD may also correspond to the memory 202.

The functions of the above-mentioned power conversion devices 10 may be implemented partially by dedicated hardware, and partially by software or firmware.

In this way, the processing circuit can implement the functions of the above-mentioned power conversion devices 10 by hardware, software, firmware, or a combination thereof.

REFERENCE SIGNS LIST

10 power conversion device, 11 cooler, 20 power conversion unit, 21 first semiconductor module (power semiconductor module), 211 power semiconductor element (detection target element), 215 inner lead, 216 P lead (power lead), 217 N lead (power lead), 218 AC lead (power lead), 21*a*, 21*b* temperature sensor, 21*c*, 21*d* voltage sensor, 21*j* joining portion, 21L, 22L, 23L lower arm, 21U, 22U, 23U upper arm, 30 phase current sensor, 40 control unit, 50 direct current power source (external power source), 60 motor (driving device)

The invention claimed is:

1. A power conversion device, comprising:

a power converter including a power semiconductor module including a plurality of power semiconductor elements, the power converter being configured to convert direct current power from an external power source into alternating current power to supply the alternating current power to a driving device; and a controller configured to control operation of the plurality of power semiconductor elements, at least one of the plurality of power semiconductor elements being a detection target element for which a temperature is to be detected, the power converter further including:

a temperature sensor configured to detect a surface temperature of the detection target element as a sensor position temperature; and a voltage sensor configured to detect an inter-terminal voltage of the detection target element, the controller being configured to calculate, when a position at which the temperature is highest on a surface of the detection target element is defined as a maximum temperature position, a loss in the detection target element based on the sensor position temperature and the inter-terminal voltage, and to estimate a maximum temperature which is the temperature at the maximum temperature position based on the calculated loss.

2. The power conversion device according to claim 1, wherein the power semiconductor module includes an upper arm and a lower arm, wherein the plurality of power semiconductor elements include a plurality of upper arm elements included in the upper arm and connected to each other in parallel, and a plurality of lower arm elements included in the lower arm and connected to each other in parallel, and wherein only one of the plurality of upper arm elements and only one of the plurality of lower arm elements are each the detection target element.

3. The power conversion device according to claim 2, wherein the controller is configured to store a relationship between the sensor position temperature and an on-resistance of the detection target element, and wherein the controller is configured to calculate the on-resistance based on the sensor position temperature, and to calculate a first current value which is a value of an electric current flowing through the detection target element based on the calculated on-resistance and the inter-terminal voltage.

4. The power conversion device according to claim 3, further comprising a phase current sensor configured to detect a phase current which is an electric current flowing through each phase of the driving device, wherein the number of the plurality of upper arm elements is two, wherein the number of the plurality of lower arm elements is two, and wherein the controller is configured to calculate a second current value which is a value of an electric current flowing through a power semiconductor element other than the detection target element among the plurality of power semiconductor elements by subtracting the first current value from the phase current detected by the phase current sensor.

5. The power conversion device according to claim 3, wherein the number of the plurality of upper arm elements is two, wherein the number of the plurality of lower arm elements is two, and wherein the controller is configured to determine a value twice the first current value as a phase current.

6. The power conversion device according to claim 3, wherein the controller is configured to store in advance a relationship of the first current value, a power factor of the detection target element, and a modulation factor of the detection target element with respect to the loss of the detection target element.

7. The power conversion device according to claim 1, wherein the power semiconductor module includes an upper arm and a lower arm, wherein the plurality of power semiconductor elements include a plurality of upper arm elements included in the upper arm and connected to each other in parallel, and a plurality of lower arm elements included in the lower arm and connected to each other in parallel, and wherein only one of the plurality of upper arm elements and the plurality of lower arm elements is the detection target element.

8. The power conversion device according to claim 1, wherein the controller is configured to store a thermal resistance difference function which is a function of a difference between a first thermal resistance and a second thermal resistance with respect to a time for which the alternating current power is supplied to the driving device, wherein the first thermal resistance is a thermal resistance between the maximum temperature position and a reference position in a heat dissipation path of the power semiconductor module, wherein the second thermal resistance is a thermal resistance between a sensor position at which the sensor position temperature is detected and the reference position, and wherein the controller is configured to estimate the maximum temperature based on the detected sensor position temperature, the calculated loss, and the stored thermal resistance difference function, and to cause the power converter to limit the alternating current power when the estimated maximum temperature exceeds a specified temperature.

9. The power conversion device according to claim 8, wherein the controller is configured to store in advance the thermal resistance difference function for all the detection target elements.

10. The power conversion device according to claim 1, wherein the power semiconductor module includes a plurality of power leads and a plurality of inner leads, wherein the plurality of power leads are each formed of a conductive metal member and have a mounting surface for mounting at least one of the plurality of power semiconductor elements or the plurality of inner leads, wherein a first power lead among the plurality of power leads is connected to a lower surface of the plurality of power semiconductor elements on the mounting surface, wherein the plurality of inner leads are each formed of a conductive metal member, and connect an upper surface which is a surface opposite to the lower surface and the mounting surface of a second power lead which is a power lead different from the first power lead among the plurality of power leads, wherein the upper surface has a joining portion between the plurality of power semiconductor elements and the plurality of inner leads arranged at a center of the upper surface, and wherein the temperature sensor is arranged on the upper surface at a peripheral portion which is closer to an outer side than the joining portion.

11. The power conversion device according to claim 10, wherein a position of the peripheral portion is a position at which the surface temperature detected by the temperature sensor is lower than an in-plane average temperature on the surface of the detection target element.

12. The power conversion device according to claim 1, further comprising a cooler for cooling the power semiconductor module by using refrigerant, wherein the cooler has a plurality of the power semiconductor modules arranged thereon along a direction in which the refrigerant flows.

* * * * *